United States Patent
Chainer et al.

(10) Patent No.: US 11,240,935 B2
(45) Date of Patent: Feb. 1, 2022

(54) ENERGY EFFICIENT DATA CENTER LIQUID COOLING WITH GEOTHERMAL ENHANCEMENT

(71) Applicant: International Business Machines Corporation, Armonk, NY (US)

(72) Inventors: Timothy J. Chainer, Putnam Valley, NY (US); Pritish R. Parida, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 16/926,663

(22) Filed: Jul. 11, 2020

(65) Prior Publication Data
US 2020/0396867 A1 Dec. 17, 2020

Related U.S. Application Data

(62) Division of application No. 15/803,755, filed on Nov. 4, 2017, now Pat. No. 10,716,239, which is a division
(Continued)

(51) Int. Cl.
*H05K 7/20* (2006.01)
*G06F 1/20* (2006.01)

(52) U.S. Cl.
CPC .......... *H05K 7/20654* (2013.01); *G06F 1/20* (2013.01); *H05K 7/2079* (2013.01); *G06F 2200/201* (2013.01)

(58) Field of Classification Search
CPC . H05K 7/20654; H05K 7/20627; Y02B 10/40
See application file for complete search history.

(56) References Cited

U.S. PATENT DOCUMENTS

| 1,981,730 A | 11/1934 | Hawkins |
| 2,167,878 A | 8/1939 | Crawford |

(Continued)

FOREIGN PATENT DOCUMENTS

| JP | 2010203663 A | 9/2010 |
| JP | 2010210193 A | 9/2010 |

(Continued)

OTHER PUBLICATIONS

Greenberg et al., Best practices for data centers: Lessons learned from benchmarking 22 data centers, Proceedings of the ACEEE Summer Study on Energy Efficiency in Buildings in Asilomar, CA. ACEEE, Aug. 2006, pp. 76-87.

(Continued)

*Primary Examiner* — Eric S Ruppert
(74) *Attorney, Agent, or Firm* — Daniel Morris; Otterstedt, Wallace & Kammer, LLP

(57) ABSTRACT

A data center cooling system is operated in a first mode, has an indoor portion wherein heat is absorbed from components in the data center by a heat transfer fluid, and has an outdoor heat exchanger portion and a geothermal heat exchanger portion. The first mode includes ambient air cooling of the heat transfer fluid in the outdoor heat exchanger portion and/or geothermal cooling of the heat transfer fluid in the geothermal heat exchanger portion. Based on an appropriate metric, a determination is made that a switch should be made from the first mode to a second, different, mode; and, responsive thereto, the data center cooling system is switched to the second mode. The second mode includes at least another of ambient air cooling of the heat transfer fluid in the outdoor heat exchanger portion and geothermal cooling of the heat transfer fluid in the geothermal heat exchanger portion.

6 Claims, 35 Drawing Sheets

Related U.S. Application Data of application No. 13/252,888, filed on Oct. 4, 2011, now Pat. No. 9,811,126.

(56) References Cited

U.S. PATENT DOCUMENTS

| | | | |
|---|---|---|---|
| 2,438,720 | A | 3/1948 | Smith |
| 2,461,449 | A | 2/1949 | Smith et al. |
| 2,513,373 | A | 7/1950 | Sporn et al. |
| 3,563,304 | A | 2/1971 | McGrath |
| 4,008,709 | A | 2/1977 | Jardine |
| 4,091,636 | A | 5/1978 | Margen |
| 4,171,721 | A | 10/1979 | Movick |
| 4,257,239 | A | 3/1981 | Partin et al. |
| 4,325,228 | A | 4/1982 | Wolf |
| 4,452,303 | A | 6/1984 | Bontje et al. |
| 5,461,876 | A | 10/1995 | Dressler |
| 7,522,418 | B2 | 4/2009 | Ishimine |
| 7,911,793 | B2 | 3/2011 | Attlesey |
| 9,811,126 | B2 | 11/2017 | Chainer et al. |
| 10,716,239 | B2 | 7/2020 | Chainer et al. |
| 2003/0147214 | A1 | 8/2003 | Patel et al. |
| 2006/0288724 | A1 | 12/2006 | Ambs et al. |
| 2007/0227710 | A1 | 10/2007 | Belady et al. |
| 2007/0289319 | A1 | 12/2007 | Kim et al. |
| 2008/0002364 | A1 | 1/2008 | Campbell et al. |
| 2008/0053130 | A1 | 3/2008 | Mueller et al. |
| 2009/0078401 | A1 | 3/2009 | Cichanowicz |
| 2009/0268404 | A1 | 10/2009 | Chu et al. |
| 2009/0283386 | A1 | 11/2009 | Diluoffo et al. |
| 2010/0078160 | A1 | 4/2010 | Novotny et al. |
| 2010/0191998 | A1 | 7/2010 | Moore |
| 2010/0236772 | A1 | 9/2010 | Novotny et al. |
| 2011/0042057 | A1 | 2/2011 | Li et al. |
| 2013/0014926 | A1 | 1/2013 | Iyengar et al. |
| 2013/0081781 | A1 | 4/2013 | Chainer et al. |
| 2018/0067525 | A1 | 3/2018 | Chainer et al. |

FOREIGN PATENT DOCUMENTS

| | | |
|---|---|---|
| WO | WO2008131041 A1 | 10/2008 |
| WO | WO2008151888 A1 | 12/2008 |
| WO | WO2009140905 A1 | 11/2009 |

OTHER PUBLICATIONS

The Data Center Solution, Verne Global 2009, pp. 1-8.

Hannemann et al., Pumped liquid multiphase cooling, ASME International Mechanical Engineering Congress and Exposition, vol. 47071, pp. 469-473, Nov. 2004.

ENERGY EFFICIENT DATA CENTER LIQUID COOLING WITH GEOTHERMAL ENHANCEMENT

CROSS-REFERENCE TO RELATED APPLICATIONS

This application is a division of U.S. patent application Ser. No. 15/803,755 filed Nov. 4, 2017, and entitled ENERGY EFFICIENT DATA CENTER LIQUID COOLING WITH GEOTHERMAL ENHANCEMENT, which is in turn a division of U.S. patent application Ser. No. 13/252,888 filed 4 Oct. 2011, and entitled ENERGY EFFICIENT DATA CENTER LIQUID COOLING WITH GEOTHERMAL ENHANCEMENT, now U.S. Pat. No. 9,811,126. The complete disclosure of U.S. patent application Ser. Nos. 15/803,755 and 13/252,888 are expressly incorporated herein by reference in their entireties for all purposes.

STATEMENT OF GOVERNMENT RIGHTS

This invention was made with Government support under Contract No.: DE-EE0002894 awarded by the Department of Energy (DOE). The Government has certain rights in this invention.

FIELD OF THE INVENTION

The present invention relates to the thermodynamic arts, and, more particularly, to thermal control of computer equipment and the like.

BACKGROUND OF THE INVENTION

Economizer based ambient cooling of data centers has been proposed as a technique to reduce data center power consumption. Economizer based ambient cooling of data centers is typically limited to winter months and requires refrigeration based cooling during hot temperature months. In any locale where temperatures below freezing are anticipated, an antifreeze solution (typically glycol based) is required within the coolant loop that is exposed to the ambient environment to avoid freeze-up if the loop circulation stops for any reason. This antifreeze solution is not as effective in thermal transport as water alone, with the degree of ineffectiveness varying depending on the exact character of the devices putting heat into the coolant loop. This lower efficiency can be significant when attempting to allow for ambient air cooling at high ambient temperatures.

SUMMARY OF THE INVENTION

Principles of the invention provide techniques for energy efficient data center liquid cooling with geothermal enhancement. In one aspect, an exemplary method includes the step of operating a data center cooling system in a first mode. The data center cooling system has an indoor portion wherein heat is absorbed from components in the data center by a heat transfer fluid. The data center cooling system has an outdoor heat exchanger portion and a geothermal heat exchanger portion. The first mode includes at least one of: ambient air cooling of the heat transfer fluid in the outdoor heat exchanger portion; and geothermal cooling of the heat transfer fluid in the geothermal heat exchanger portion. Further steps include determining, based on an appropriate metric, that a switch should be made from the first mode to a second mode; and, responsive to the determining, switching the data center cooling system to the second mode. The second mode is different than the first mode. The second mode includes at least another one of: ambient air cooling of the heat transfer fluid in the outdoor heat exchanger portion; and geothermal cooling of the heat transfer fluid in the geothermal heat exchanger portion.

In another aspect, an exemplary data center cooling system includes an indoor portion wherein heat is absorbed from components in the data center by a heat transfer fluid; an outdoor heat exchanger portion in selective fluid communication with the indoor portion; a geothermal heat exchanger portion in selective fluid communication with the indoor portion; and a valve arrangement configured to switch the data center cooling system between first and second modes of operation. The first mode includes at least one of: ambient air cooling of the heat transfer fluid in the outdoor heat exchanger portion; and geothermal cooling of the heat transfer fluid in the geothermal heat exchanger portion. The second mode is different than the first mode and includes at least another one of: ambient air cooling of the heat transfer fluid in the outdoor heat exchanger portion; and geothermal cooling of the heat transfer fluid in the geothermal heat exchanger portion.

In still another aspect, a data center cooling system includes an indoor portion wherein heat is absorbed from electronic components in the data center by a heat transfer fluid; and a geothermal heat exchanger portion in thermal communication with the indoor portion and configured to reject the heat to at least one of earth and groundwater.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed; or by sending signals to control a valve, fan, or the like, based on sensed temperature, pressure, flow, or the like. For the avoidance of doubt, where an actor facilitates an action by other than performing the action, the action is nevertheless performed by some entity or combination of entities.

One or more embodiments of the invention or elements thereof (for example, system control and/or system design) can be implemented in the form of, or otherwise facilitated by, a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein. Examples of use of a computer program product or computer-related means include sending signals to control a valve, fan, or the like, based on sensed temperature, pressure, flow, heat dissipation, or the like; and/or use of a computer for computer-aided system design.

Techniques of the present invention can provide substantial beneficial technical effects. In one or more embodiments, a significant technical benefit is the ability to provide cooling to a data center year round in any geography. For ambient air cooling in high ambient temperature environments, a geothermal loop can significantly enhance the cooling performance by providing additional heat dissipation to the ambient (surroundings).

These and other features and advantages of the present invention will become apparent from the following detailed description of illustrative embodiments thereof, which is to be read in connection with the accompanying drawings.

DETAILED DESCRIPTION OF PREFERRED EMBODIMENTS

As noted, economizer based ambient cooling of data centers has been proposed as a technique to reduce data center power consumption. Economizer based ambient cooling of data centers is typically limited to winter months and requires refrigeration based cooling during hot temperature months. In one or more embodiments, to eliminate the need for refrigeration based cooling, a liquid based system which uses the ambient environment can be used, and can be enhanced via a geothermal liquid cooling loop which can operate as needed, and can be placed in parallel or series.

In any locale where temperatures below freezing are anticipated, an antifreeze solution (typically glycol based) is required within the coolant loop that is exposed to the ambient environment to avoid freeze-up if the loop circulation stops for any reason. This antifreeze solution is not as effective in thermal transport as water alone, with the degree of ineffectiveness varying depending on the exact character of the devices putting heat into the coolant loop. This lower efficiency can be significant when attempting to allow for ambient air cooling at high ambient temperatures. In one or more embodiments, with the addition of a geothermal liquid cooling loop, thermal performance of ambient air cooling at high ambient temperatures can be significantly enhanced.

In one or more instances, a geothermal loop is added to an ambient liquid cooling solution for data centers. For ambient air cooling in high ambient temperature environments, a geothermal loop can significantly enhance the cooling performance by enhancing the heat dissipation to the ambient (surroundings). For ambient air cooling in very low ambient temperature environments, a geothermal loop can help maintain the liquid going to the system at certain minimum temperature.

In one or more embodiments, the system is implemented by adding a series of three-way valves (which can be computer controlled) to incorporate a geothermal liquid cooling loop into an ambient liquid cooling solution for data centers. The geothermal loop can be incorporated either in a series or in a parallel arrangement giving flexibility to operate at more than more stage. One or more embodiments can work in three stages (also referred to as modes):

(1) completely in geothermal cooling mode,
(2) completely in ambient air cooling mode, and
(3) Dual/Hybrid mode wherein both geothermal cooling and ambient air cooling mode are active.

The following figures explain the working and implementation of one or more non-limiting exemplary embodiments of systems with geothermal enhancement for liquid cooled data centers.

Figure 1:
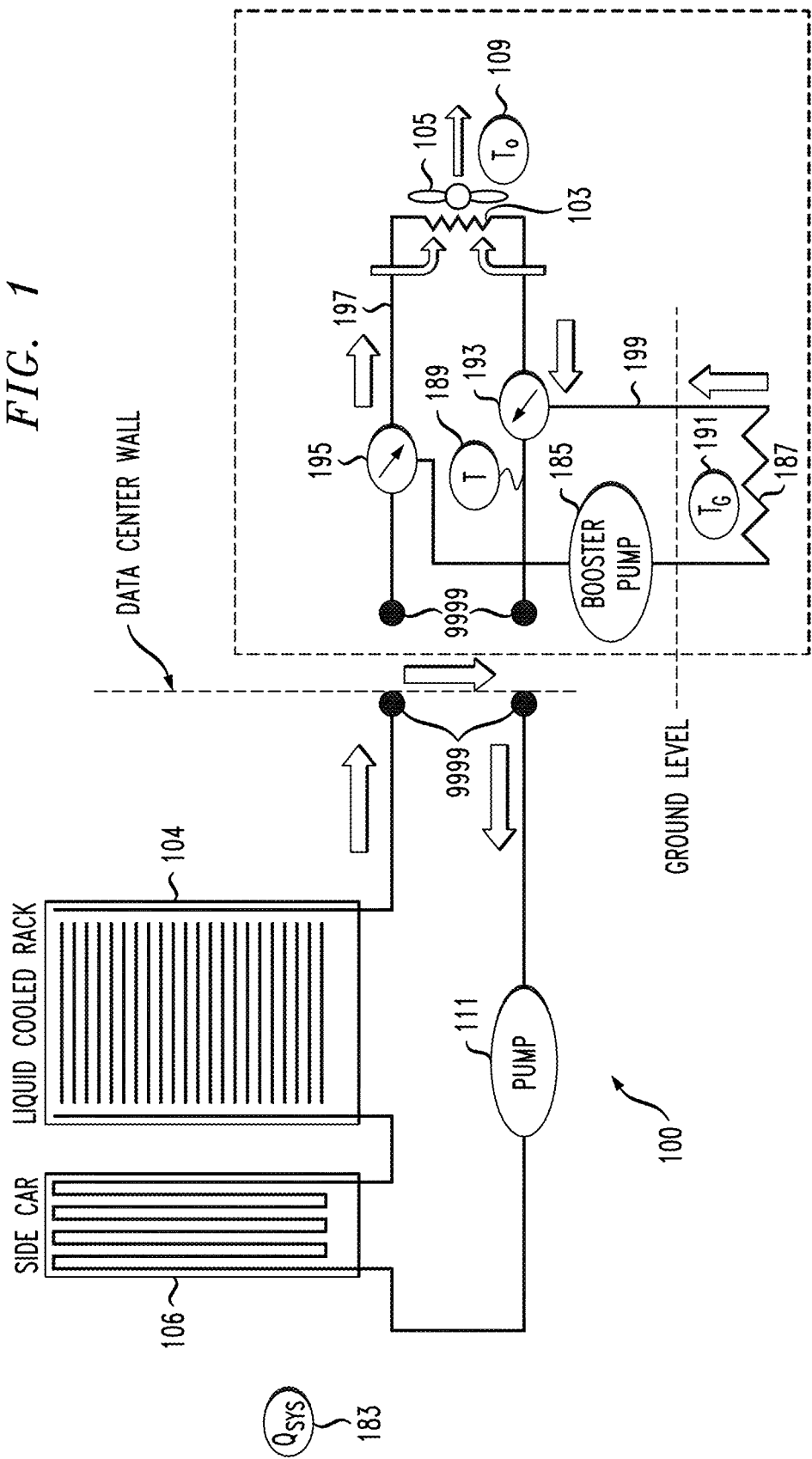
FIG. 1 shows an exemplary data center liquid cooling system, according to an aspect of the invention.

FIG. 1 shows a way of implementing an exemplary embodiment in a liquid cooled data center 100 with an air side outdoor heat exchanger 103 (optionally also including fan 105 but could in some instances use free convection). The system being cooled includes a liquid cooled rack 104 and a side car segment 106 (the side car segment is an air-to-liquid heat exchanger, basically a radiator similar to a car's radiator) and is present inside the data center 100. The liquid pump 111 can either be placed inside the data center unit or outside. The geothermal loop 199 is connected to the ambient air cooling loop 197 in a parallel arrangement with the help of three-way valves 195, 193. These three-way valves can be computer controlled. In case of computer controlled three-way valves, the outside air temperature $T_O$ measured by sensor 109, ground temperature TG measured by sensor 191, and the temperature of the liquid entering the data center system T measured by sensor 189 can be used as control parameters for the three-way valve control technique. The working of this particular implementation is schematically explained through FIG. 2-FIG. 5. Note geothermal coil 187 for dissipating heat below ground level and optional booster pump 185. Note also system heat dissipation sensor $Q_{SYS}$ 183. In the case of computer controlled three-way valves, in addition to the measured temperatures, system heat dissipation sensor QSYS 183 can also optionally be used as a control parameter for the three-way valve control technique.

The dots 9999 in the figures represent pipe connectors and the gap there-between is not intended to suggest a physical gap in the pipes, but rather to delineate that the portion of the given figure that is on the left of the dots represents an information technology (IT) rack while the portion of the given figure on the right of the dots represent the piping scheme for the coolant switch operation of one or more embodiments.

Non-limiting examples of coolants include water and glycol. FIG. 1 represents a closed loop geothermal cooling parallel arrangement. Geothermal coil 187 is used to dissipate heat below ground level. In at least some cases, coil 187 is at least 2 m below ground level. The ground level temperature may vary, for example, from about 42 F to about 80 F, depending on location. See discussion with respect to FIG. 34 below.

Figure 2:
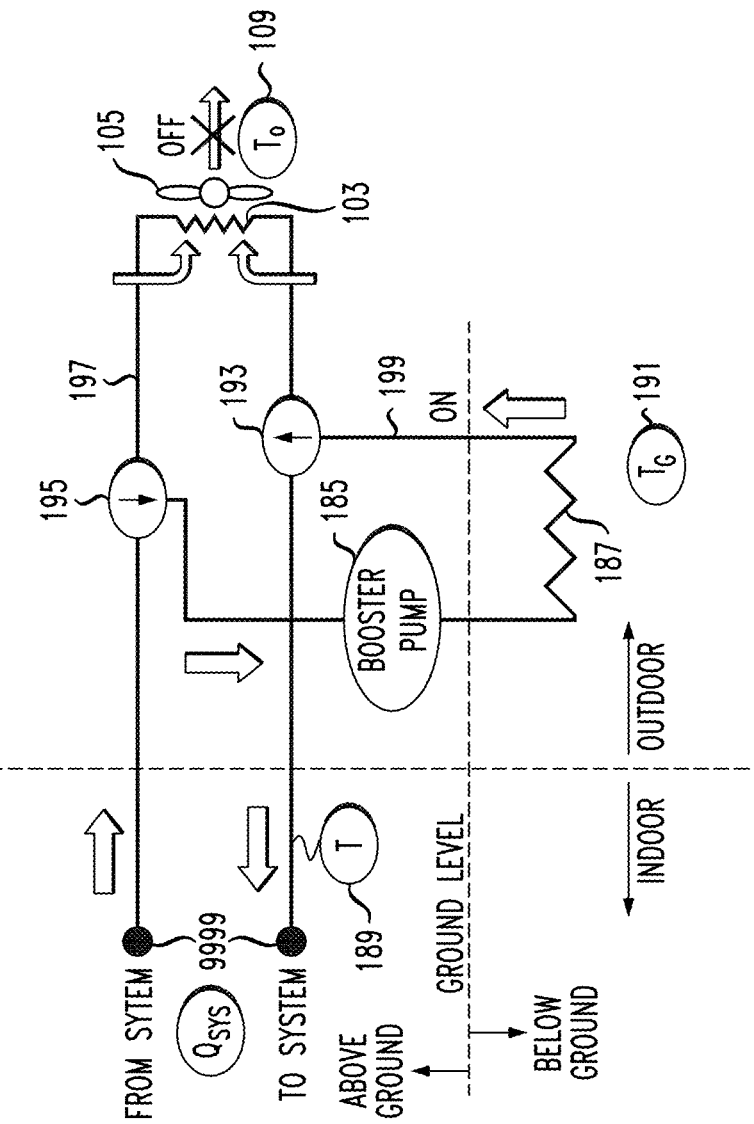
FIGS. 2-4 show four stages in operation of the system of FIG. 1.

FIG. 2 represents Stage 1A in which only the geothermal loop 199 is active and the ambient air cooling loop 197 is inactive. Depending upon the required coolant flow rate, the booster pump 185 can be either ON or OFF. The outside heat exchanger 103 is OFF (as is fan 105 if present) and the 3-way valves 193, 195 are completely turned so as to allow flow only through the geothermal loop.

Figure 3:
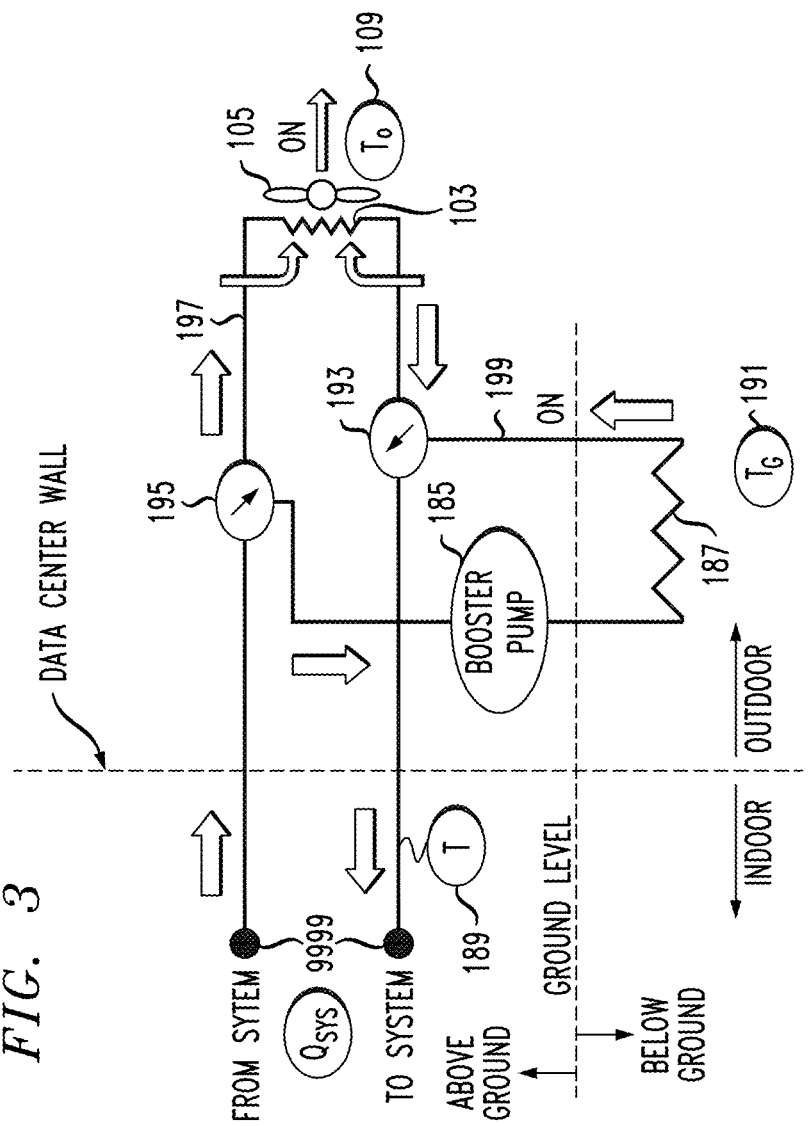

FIG. 3 represents Stage 1B in which both the geothermal cooling 199 and ambient air cooling 197 loops are active. Again, depending upon the required coolant flow rate, the booster pump 185 can either be ON or OFF. The outside heat exchanger 103 is ON (as is fan 105 if present) and the 3-way valves 193, 195 are partially turned so as to allow flow through both the geothermal and ambient air cooling loops.

Figure 4:
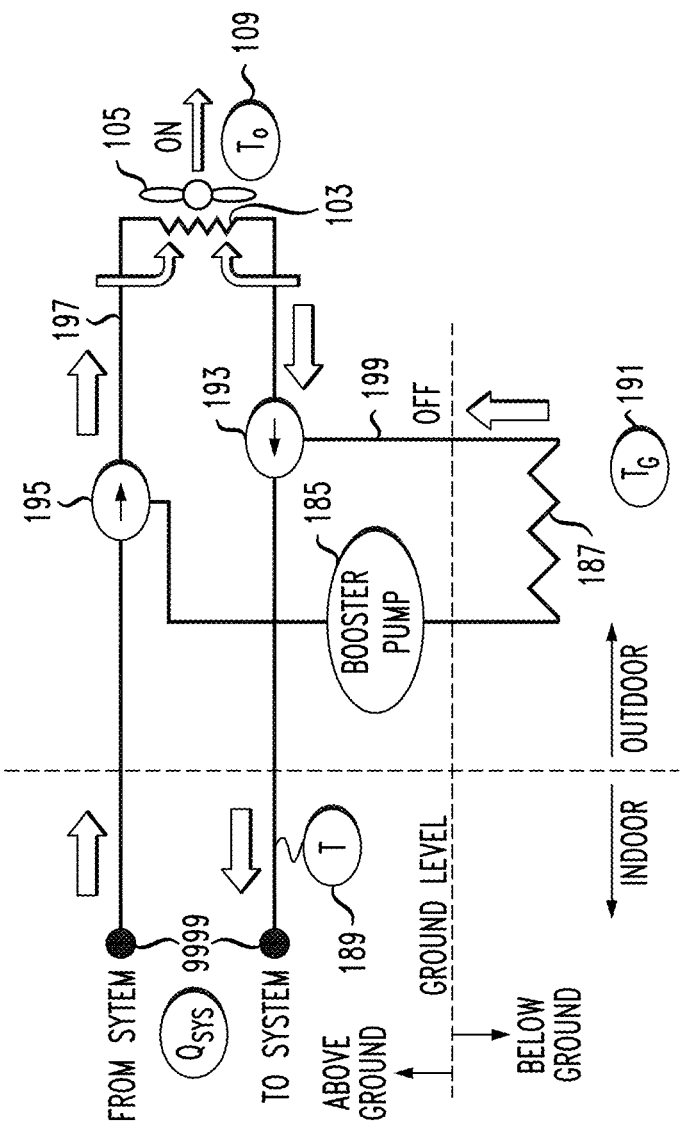

FIG. 4 represents Stage 1C in which only the ambient air cooling loop 197 is active and the geothermal loop 199 is inactive. The outside heat exchanger 103 is ON (as is fan 105 if present) and the 3-way valves 193, 195 are completely turned to allow flow only through the ambient air cooling loop. Since there no flow through the geothermal loop, the booster pump 185 remains OFF.

Figure 5:
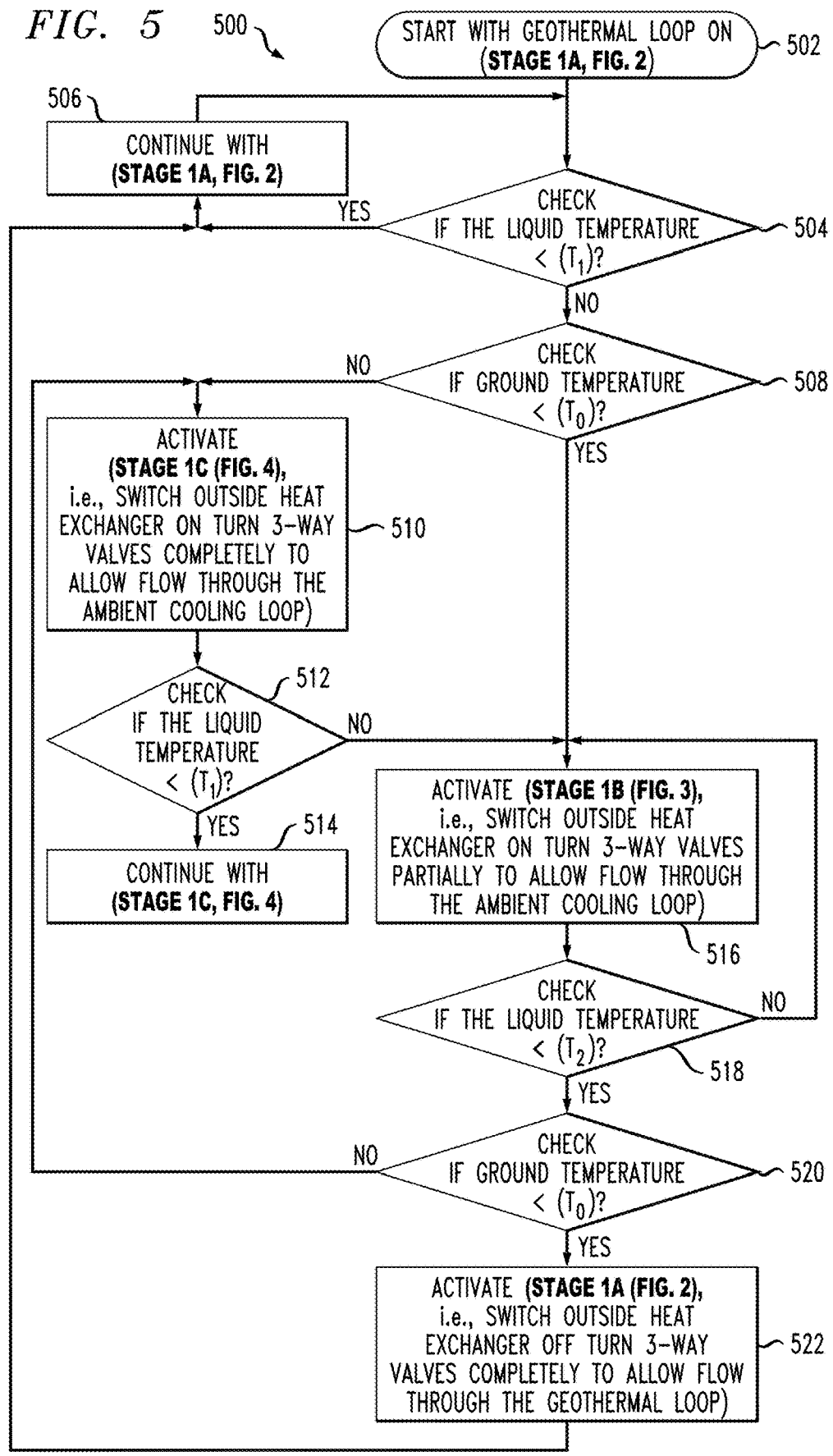
FIG. 5 shows a flow chart for operation of the system of FIG. 1.

FIG. 5 is a flowchart 500 that illustrates a non-limiting exemplary operational procedure for the geothermal cooling enhancement arrangement of FIGS. 1-4. The cooling system can be initiated from any stage. However, for simplicity, Stage 1A (FIG. 2) is represented as the initial state of the cooling system, as at 502. The outdoor air temperature $T_O$, the ground temperature TG and the temperature T of the liquid entering the data center system are constantly monitored. Based on these temperatures, different stages of the scheme can be activated. As seen at step 504, if T is less than $T_1$, simply continue to operate in stage 1A, as seen at step 506, per the "Y" branch of decision block 504.

When the temperature of the liquid entering the data center is higher than the maximum allowed temperature for liquid entering the data center ($T_1$), as per the "N" branch of decision block 504, the geothermal loop alone is not capable of dissipating the heat to the surroundings and the cooling system requires a different stage of operation. In this situation, a check is made whether the outside air temperature is higher than the ground temperature, as at 508. If yes, the ambient air cooling loop will also be activated (that is, Stage 1B, FIG. 3), as per step 516 from the "Y" branch of block 508. If No, the ambient air cooling loop will be activated and the geothermal loop will be deactivated (that is, Stage 1C, FIG. 4), as per step 510 and the "N" branch of decision block 508. If, at this stage, the temperature of the liquid entering the data center is higher than the maximum allowed temperature ($T_1$), as per the "N" branch of decision block 512, then the ambient air cooling loop only is also not capable of dissipating the heat to the surroundings and the cooling system requires the dual (hybrid) stage of operation (that is, Stage 1B, FIG. 3) as per step 516 reached via the "N" branch of block 512. If, on the other hand, the temperature of the liquid entering the data center is not higher than the maximum allowed temperature ($T_1$), as per the "Y" branch of decision block 512, then continue with Stage 1C, FIG. 4, as per step 514.

Considering again step 516, once the system is in the hybrid mode of operation, it will continually check whether the temperature of the liquid entering the data center system is higher than a minimum temperature allowed for liquid entering the data center when both loops are operational ($T_2$), as at 518. If so, continue in hybrid mode as per the N branch of decision block 518. If not, as per the "Y" branch of block 518, either of the other two modes will be activated based on the outdoor air and ground temperature, as indicated at 520, 522. In particular, if the ground temperature is not less than $T_O$, as per the N branch of block 520, then proceed to step 510 for operation in stage 1C. If the ground temperature is less than $T_O$, as per the Y branch of block 520, then proceed to step 522 for operation in stage 1A.

The switching between different modes of operation can take place N number of times a year depending upon the location of the system, weather conditions of the location, and other environmental factors. In general, N is a positive integer.

Figure 6:
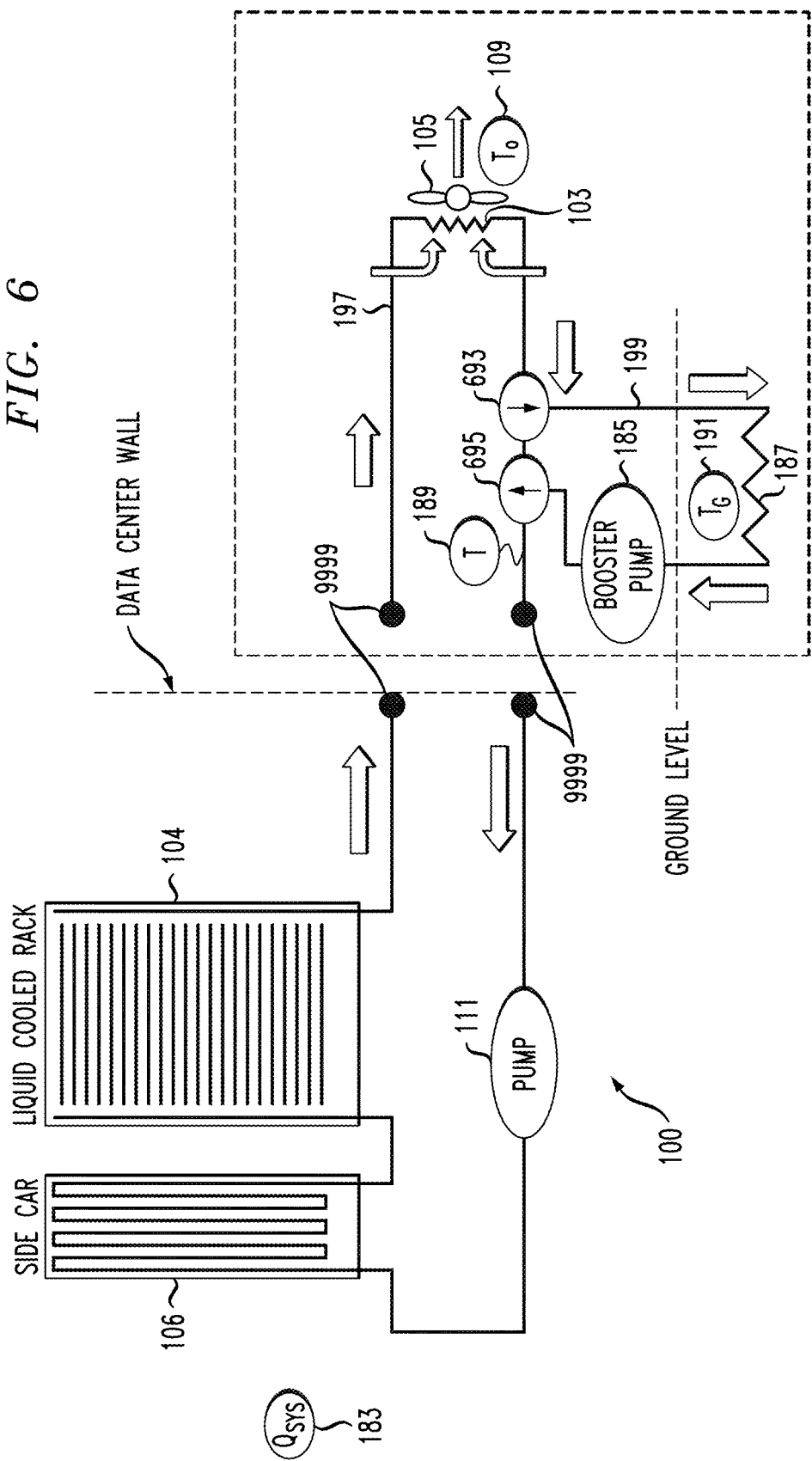
FIG. 6 shows another exemplary data center liquid cooling system, according to an aspect of the invention.

FIG. 6 shows an alternative embodiment having a series arrangement in a liquid cooled data center 100 with an air side outdoor heat exchanger. In general, similar elements in the figures have a similar reference character and are not necessarily described again in each figure, and similar variables in the figures have a similar variable name. The system being cooled includes a liquid cooled rack 104 and a side car segment 106 and is present inside the data center 100. The liquid pump 111 can either be placed inside the data center unit or outside. The geothermal loop 199 is connected to the ambient air cooling loop 197 in a series arrangement with the help of three-way valves 693, 695. These three-way valves can be computer controlled. In case of computer controlled three-way valves, the outside air temperature, the ground temperature and the temperature of the liquid entering the data center system can be used as control parameters for the three-way valve control technique. The working of this particular exemplary embodiment is schematically explained through FIG. 7-FIG. 10.

Non-limiting examples of coolants include water and glycol. FIG. 6 represents a closed loop geothermal cooling series arrangement. Geothermal coil 187 is used to dissipate heat below ground level. In at least some cases, coil 187 is at least 2 m below ground level. The ground level temperature may vary, for example, from about 42 F to about 80 F, depending on location. See discussion with respect to FIG. 34 below.

Figure 7:
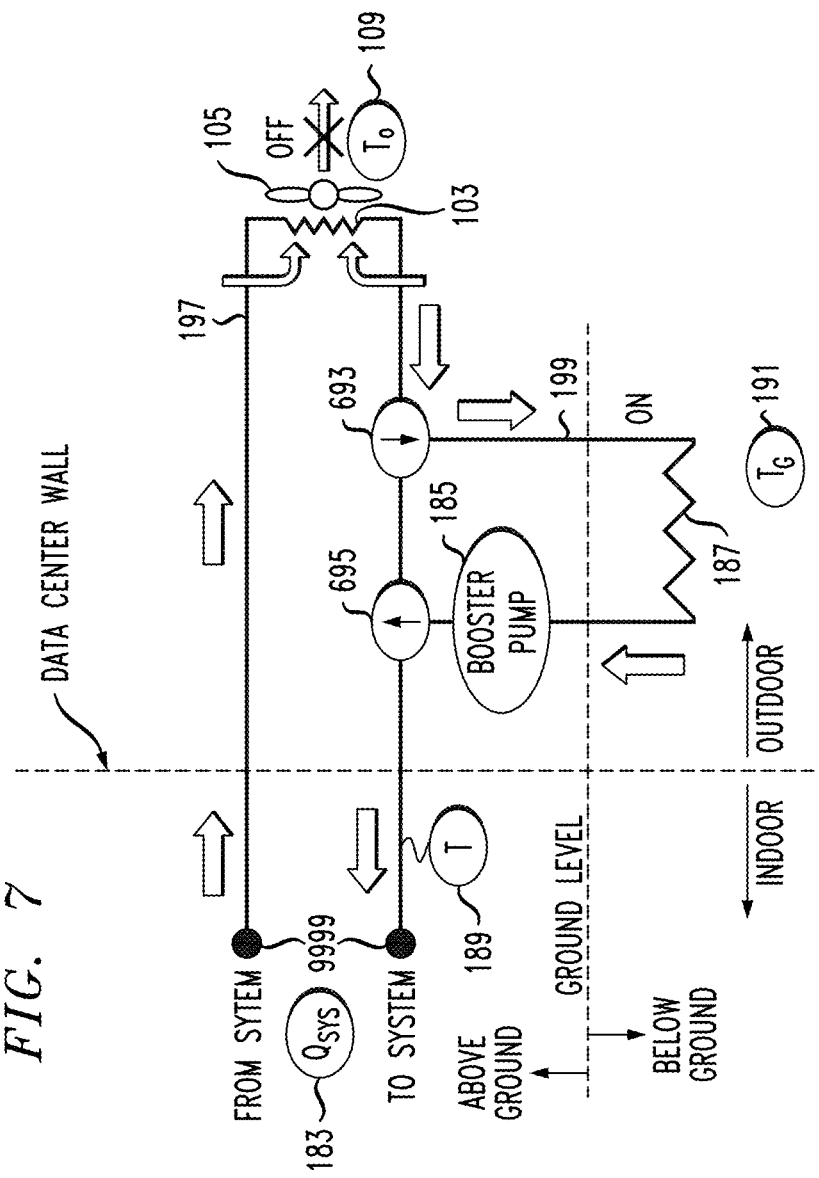
FIGS. 7-9 show four stages in operation of the system of FIG. 6.

FIG. 7 represents Stage 2A in which only the geothermal loop 199 is active and the ambient air cooling loop 197 is inactive. Depending upon the required coolant flow rate, the optional booster pump 185 can be either ON or OFF. The outside heat exchanger 103 is OFF (as is the fan 105 if present) and the three-way valves 693, 695 are completely turned so as to allow flow through the geothermal loop.

Figure 8:
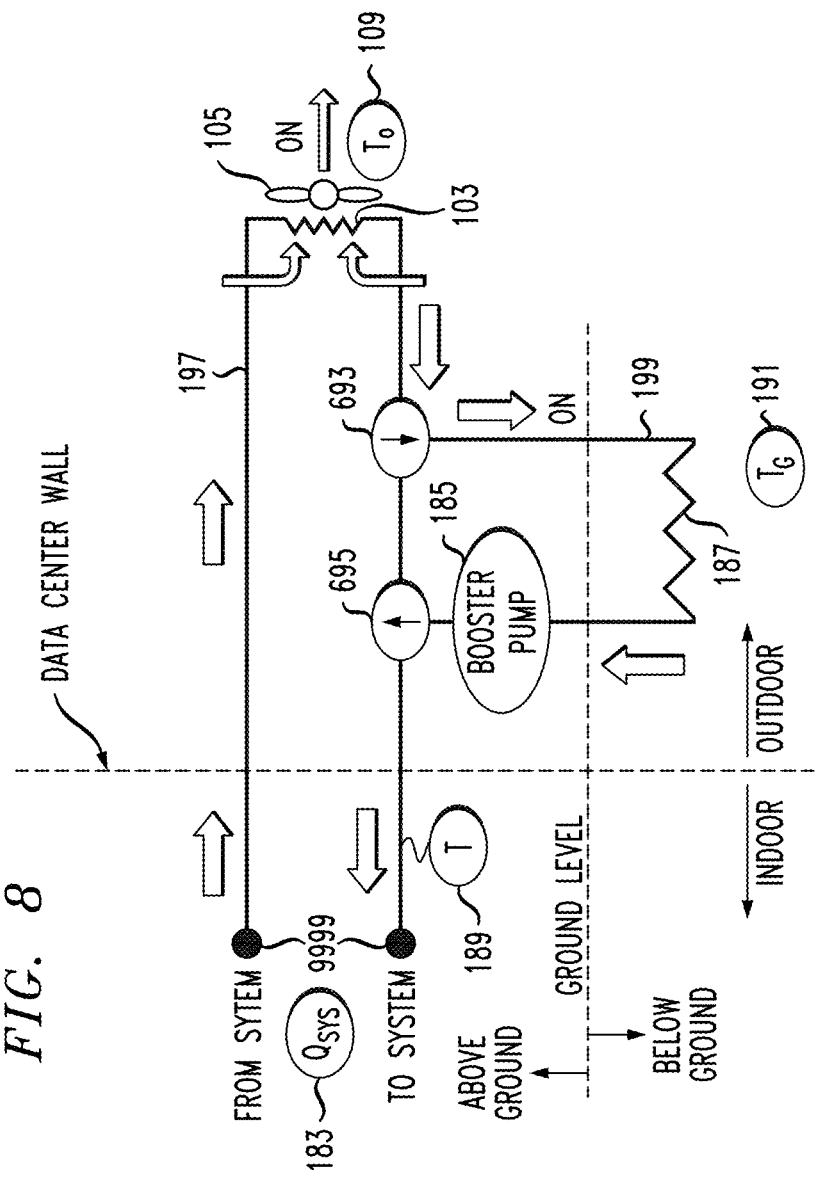

FIG. 8 represents Stage 2B in which both the geothermal cooling 199 and the ambient air cooling 197 loops are active. Again, depending upon the required coolant flow rate, the booster pump 185 can either be ON or OFF. The outside heat exchanger 103 is ON (as is fan 105 if present) and the three-way valves 693, 695 are completely turned so as to allow flow through both the geothermal and ambient air cooling loops.

Figure 9:
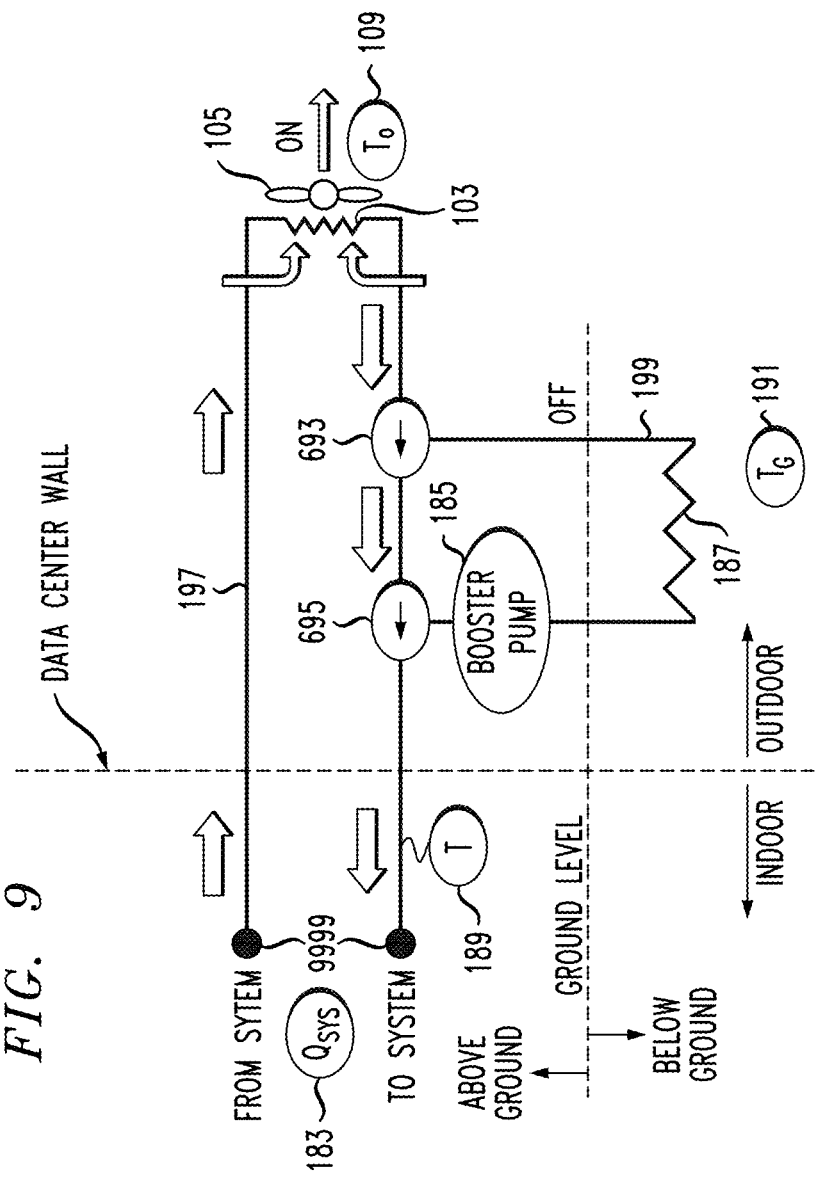

FIG. 9 represents Stage 2C in which only the ambient air cooling loop 197 is active and the geothermal loop 199 is inactive. The outside heat exchanger 103 is ON (as is fan 105 if present) and the three-way valves 693, 695 are completely turned to stop the flow through the geothermal cooling loop and to allow flow only through the ambient air cooling loop. Since there no flow through the geothermal loop, the optional booster pump 185 remains OFF.

Figure 10:
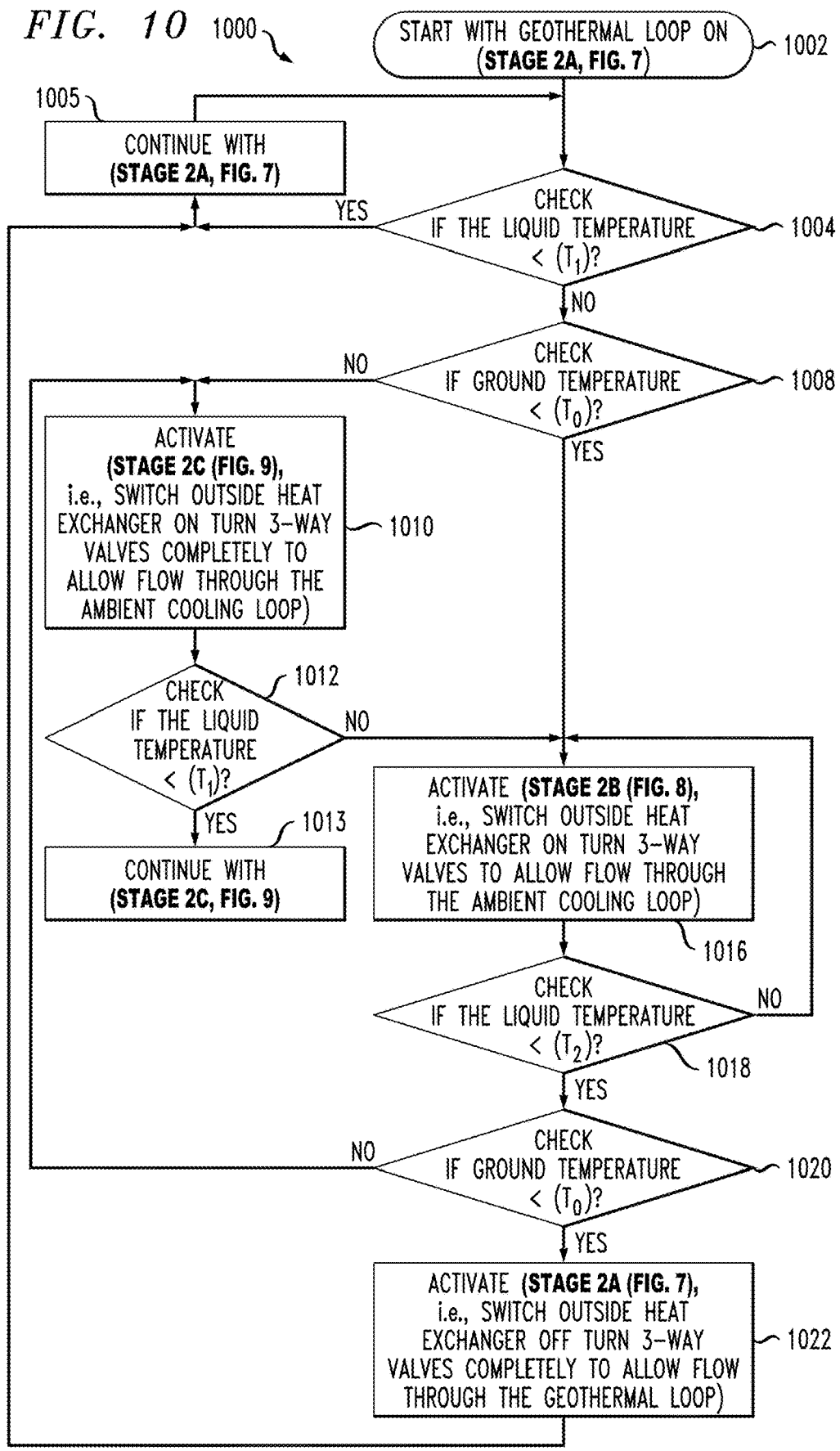
FIG. 10 shows a flow chart for operation of the system of FIG. 6.

FIG. 10 is a flowchart 1000 that illustrates a non-limiting exemplary operational procedure for the geothermal cooling enhancement arrangement of FIGS. 6-9. The cooling system can be initiated from any stage, however, for simplicity, Stage 2A (FIG. 7) is represented as the initial state of the cooling system, as per 1002. The outdoor air temperature, the ground temperature and the temperature of the liquid entering the data center system are constantly monitored and based on these temperatures, different stages can be activated. When the temperature of the liquid entering the data center is higher than the maximum allowed temperature ($T_1$), as per the "N" branch of decision block 1004, the geothermal loop only is not capable of dissipating the heat to the surroundings and the cooling system requires a different stage of operation (otherwise, as per the "Y" branch of decision block 1004, simply continue with stage 2A as at 1005).

Following the "N" branch of block 1004, a check is made, at decision block 1008, whether the outside air temperature is higher than the ground temperature. If yes ("Y" branch of block 1008), the ambient air cooling loop will also be activated (that is, Stage 2B, FIG. 8), as per step 1016. If no ("N" branch of block 1008), the ambient air cooling loop will be activated and the geothermal loop will be deactivated (that is, Stage 2C, FIG. 9), as per step 1010. If at this stage, the temperature of the liquid entering the data center is higher than the maximum allowed temperature ($T_1$) ("N" branch of block 1012), then, the ambient air cooling loop only is also not capable of dissipating the heat to the surrounding and the cooling system requires the dual (hybrid) stage (mode) of operation (that is, Stage 2B, FIG. 8), as per step 1016 (otherwise simply continue in stage 2C as per 1013 reached from "Y" branch of block 1012). Once the system is in the hybrid mode of operation, it will continually check whether the temperature of the liquid entering the data center system is higher than a minimum temperature ($T_2$), as per step 1018 (if higher than minimum, keep checking as per "N" branch of block 1018). If not ("Y" branch of block 1018), either of the other two modes will be activated based on the outdoor air and ground temperature, as per steps 1020, 1022. In particular, if the ground temperature is not less than the outside temperature, as per the "N" branch of decision block 1020, proceed to step 1010 for operation in stage 2C; otherwise, proceed to step 1022 for operation in stage 2A via "Y" branch of block 1020.

The switching between different modes of operation can take place N number of times a year depending upon location of the system, weather conditions of the location, and other environmental factors.

Figure 11:
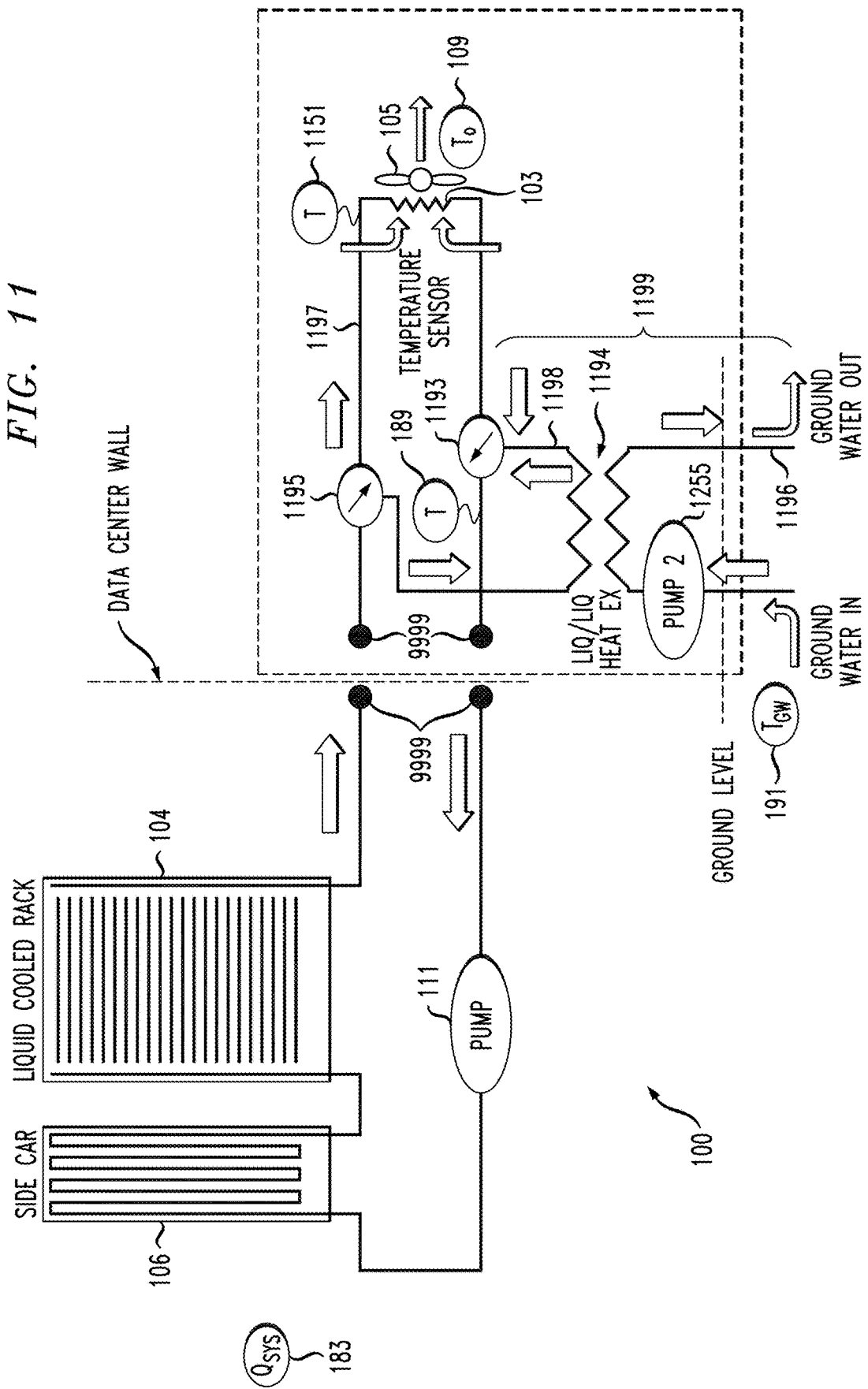
FIG. 11 shows still another exemplary data center liquid cooling system, according to an aspect of the invention.

FIG. 11 shows another alternative embodiment. The system being cooled includes a liquid cooled rack 104 and a side car segment 106 and is present inside the data center. The liquid pump 111 can either be placed inside the data center unit or outside. The geothermal loop 1199 in this particular configuration uses the ground water for dissipating the system heat to the surroundings. The geothermal loop is connected to the ambient air cooling loop 1197 in a parallel arrangement with the help of three-way valves 1193, 1195. These three-way valves can be computer controlled. In case of computer controlled three-way valves, the outside air temperature, the ground temperature and the temperature of the liquid entering the data center system can be used as control parameters for the three-way valve control technique. In a preferred approach, there are two temperature sensors associated with the liquid passing through the heat exchanger 102—one 1151 at the inlet to the outside air heat exchanger and the other (omitted to avoid clutter) at the outlet from the outside air heat exchanger. These two sensors will be used to monitor the amount of heat dissipated to the outside air through the heat exchanger. Also based on this information the position of the three-way valve can be controlled. Note that geothermal loop 1199 includes upper loop 1198 and lower (ground water) loop 1196 thermally coupled by liquid-to-liquid heat exchanger 1194.

Non-limiting examples of coolants include water and glycol. FIG. 11 represents an open loop geothermal cooling parallel arrangement. In at least some cases, groundwater is taken from at least 2 m below ground level. The ground level temperature may vary, for example, from about 42 F to about 80 F, depending on location. See discussion with respect to FIG. 34 below.

The working of this particular implementation is schematically explained through FIGS. 12-15.

Figure 12:
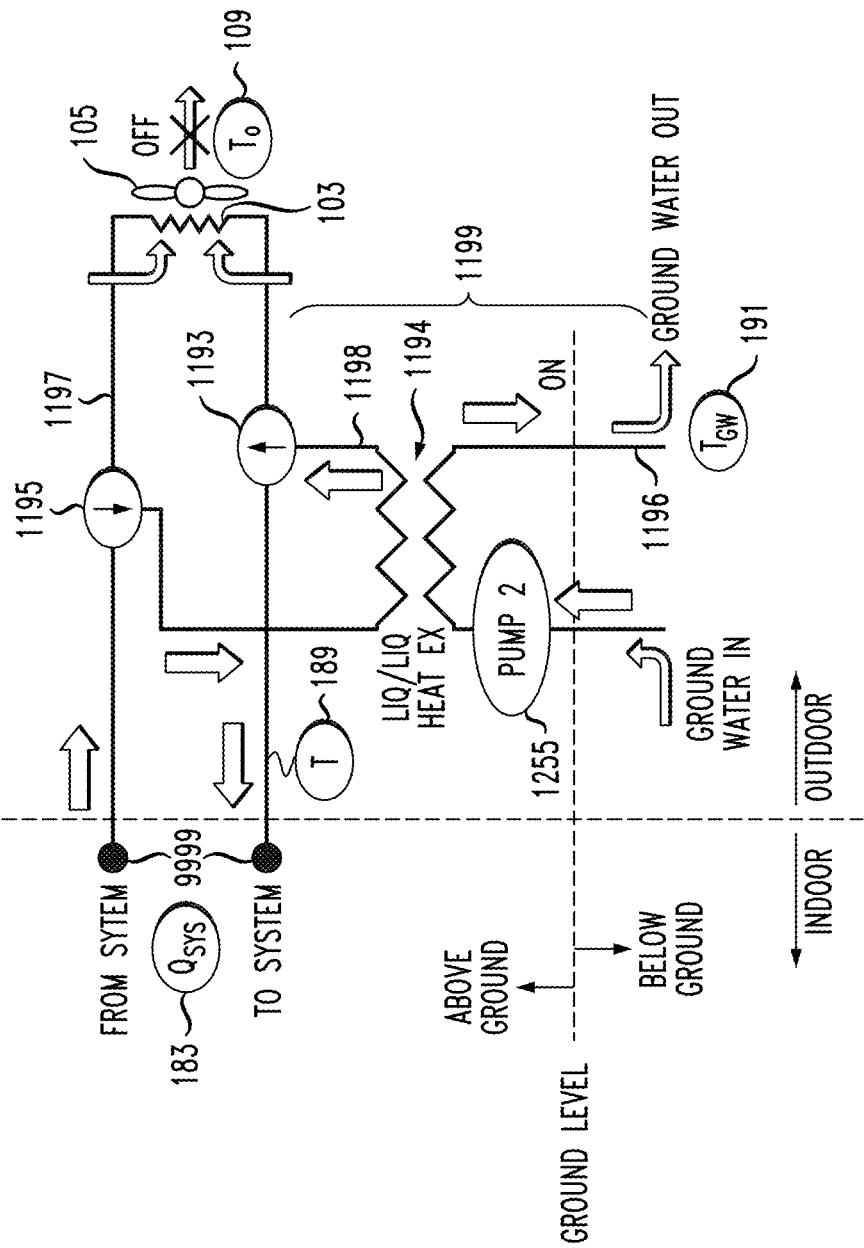
FIGS. 12-14 show four stages in operation of the system of FIG. 11.

FIG. 12 represents Stage 3A in which only the geothermal loop 1199 is active and the ambient air cooling loop 1197 is inactive. Pump-2 1255 is ON, the outside heat exchanger 103 (and fan 105 if present) is/are OFF and the three-way valves 1193, 1195 are completely turned so as to allow flow only through the geothermal loop.

Figure 13:
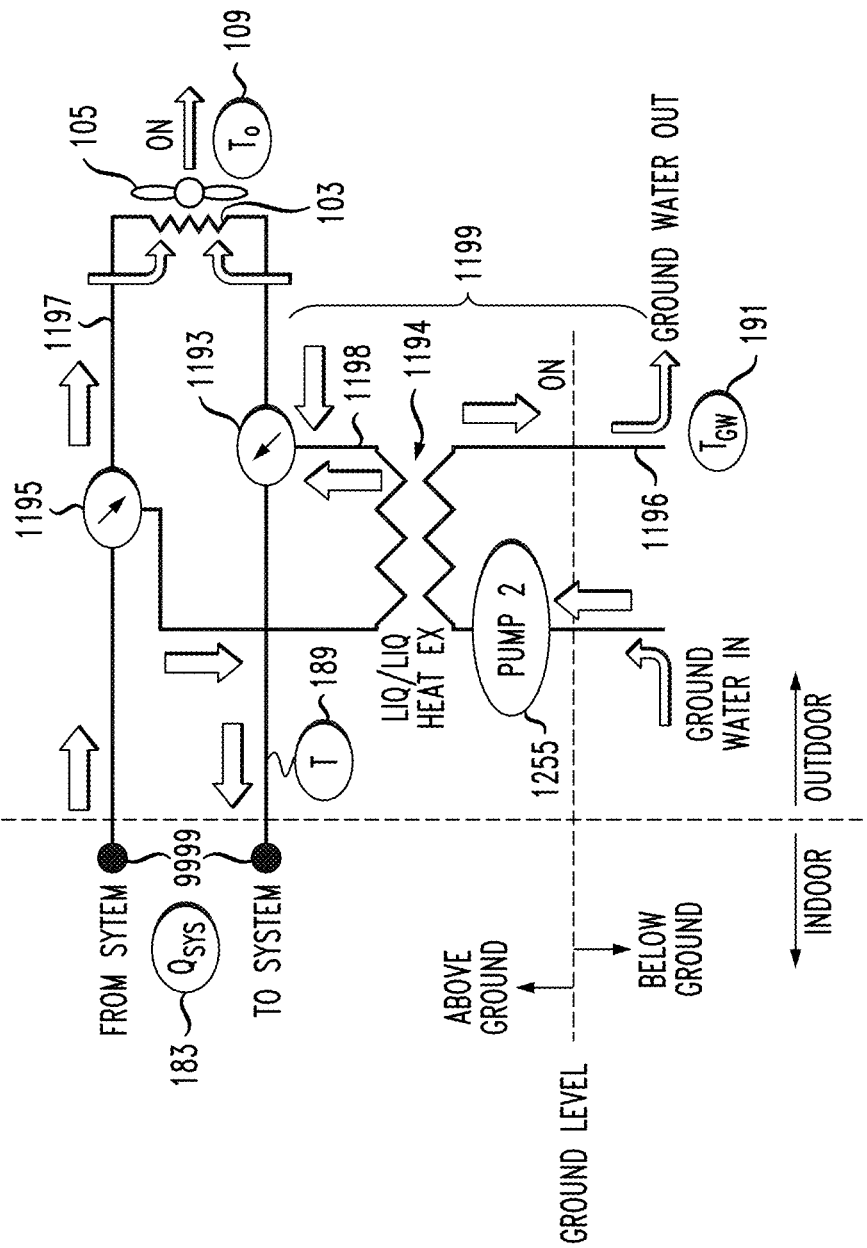

FIG. 13 represents Stage 3B in which both the geothermal cooling 1199 and ambient air cooling loops 1197 are active. Pump-2 1255 is ON, the outside heat exchanger 103 (and fan 105 if present) is/are ON and the three-way valves are partially turned so as to allow flow through both the geothermal and ambient air cooling loops.

Figure 14:
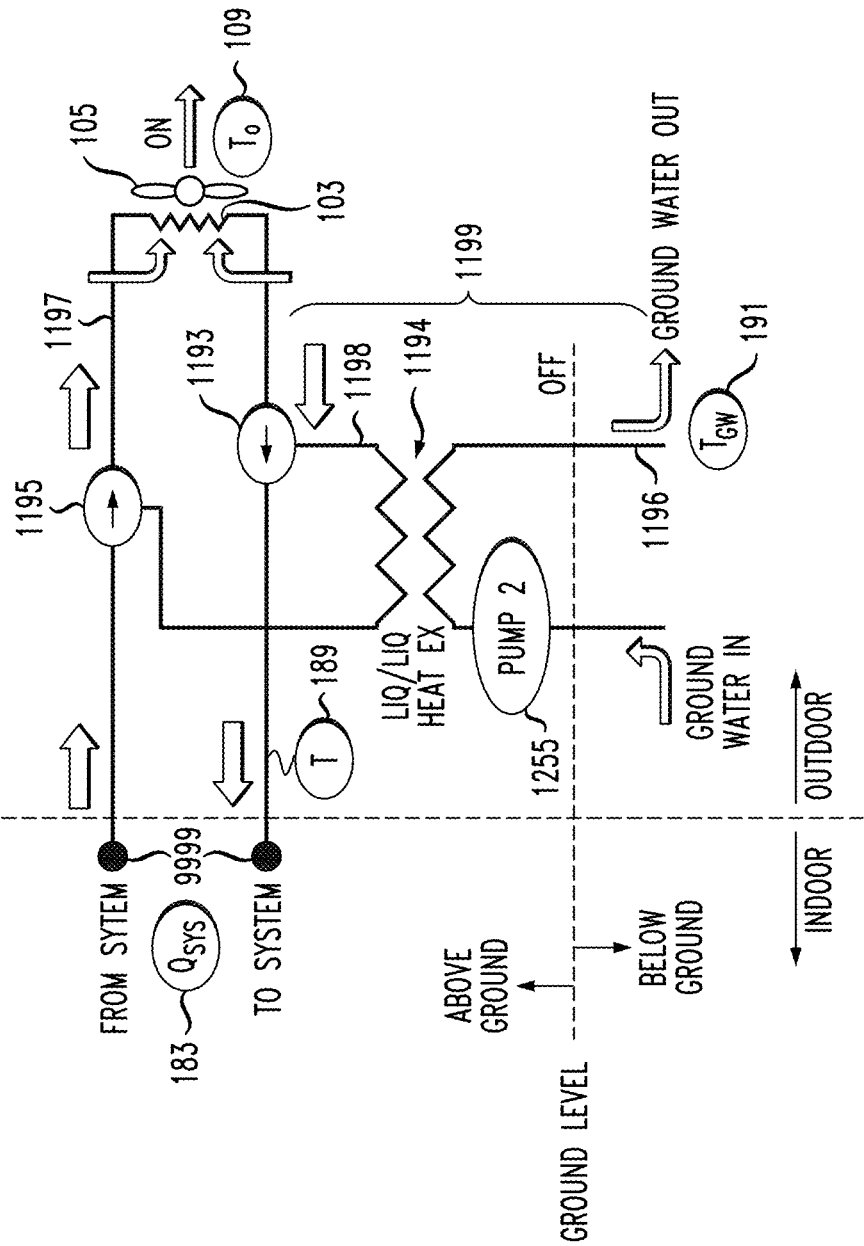

FIG. 14 represents Stage 3C in which only the ambient air cooling loop 1197 is active and the geothermal loop 1199 is inactive. The outside heat exchanger 103 (and fan 105 if present) is/are ON and the three-way valves are completely turned to allow flow only through the ambient air cooling loop 1197. Since there is no flow through the geothermal loop, Pump-2 1255 remains OFF.

Figure 15:
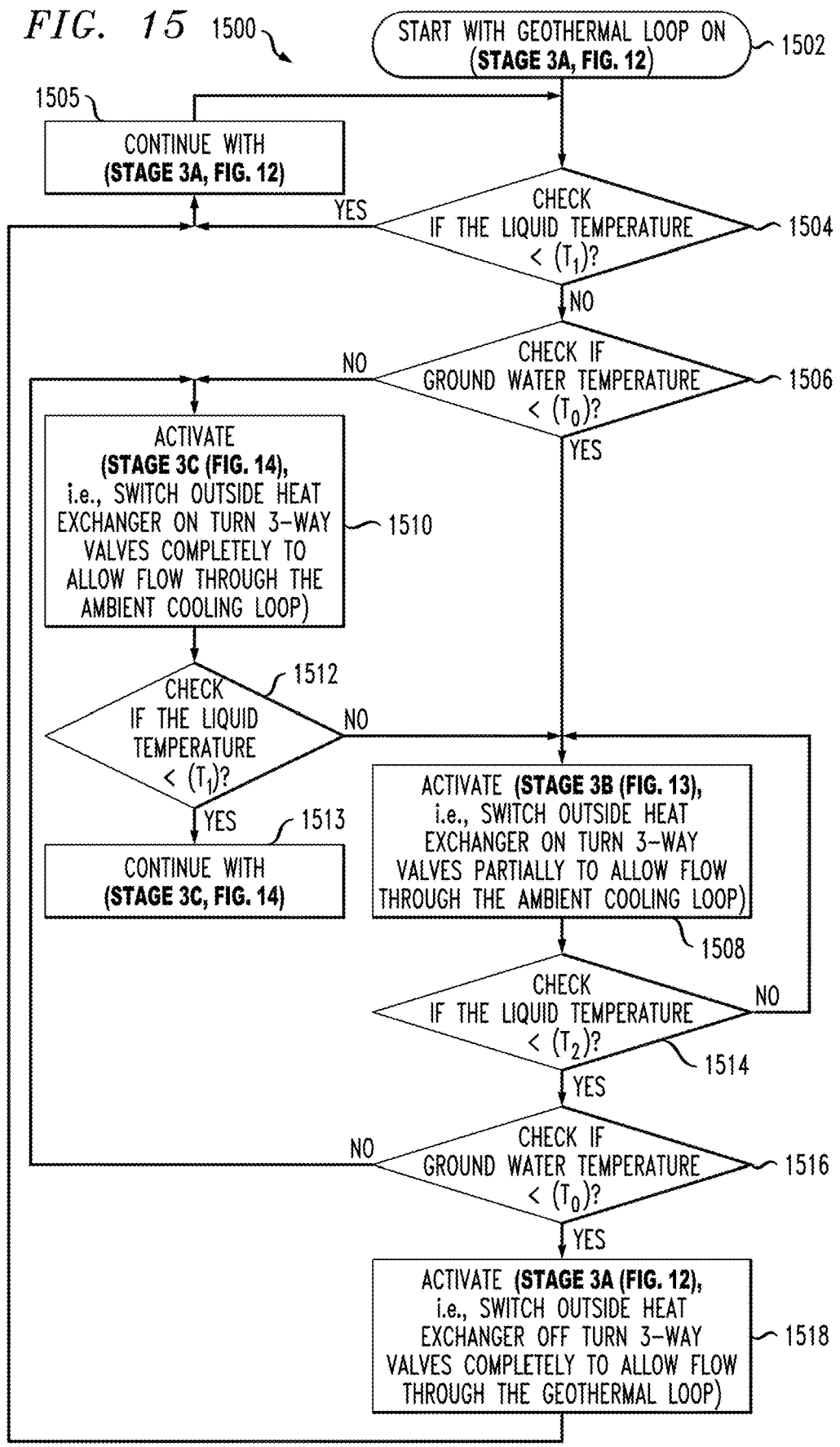
FIG. 15 shows a flow chart for operation of the system of FIG. 11.

FIG. 15 is a flowchart 1500 that illustrates an exemplary operational technique for the embodiment of FIGS. 11-14. The cooling system can be initiated from any stage; however, for simplicity, Stage 3A (FIG. 12) is represented as the initial state of the cooling system, as per step 1502. The outdoor air temperature, the ground temperature and the temperature of the liquid entering the data center system are constantly monitored and based on these temperatures, different stages can be activated. When the temperature of the liquid entering the data center is higher than the maximum allowed temperature ($T_1$) ("N" branch of decision block 1504), the geothermal loop only is not capable of dissipating the heat to the surroundings and that the cooling system requires a different stage of operation (otherwise, as per the "Y" branch, continue in Stage 3A as per 1505).

Following the "N" branch of block 1504, as per decision block 1506, a check is made whether the outside air temperature is higher than the ground temperature. If yes, as per the "Y" branch of block 1506, the ambient air cooling loop will also be activated (that is, Stage 3B, FIG. 13), as per step

1508. On the other hand, if the outside air temperature is not higher than the ground temperature, as per the "N" branch of decision block 1506, the ambient air cooling loop will be activated and the geothermal loop will be deactivated (that is, Stage 3C, FIG. 14), as per step 1510. If at this stage, the temperature of the liquid entering the data center is higher than the maximum allowed temperature ($T_1$), as per the "N" branch of decision block 1512, then, the ambient air cooling loop only is also not capable of dissipating the heat to the surroundings and the cooling system requires the dual (hybrid) stage of operation (that is, Stage 3B, FIG. 13), as per step 1508 (otherwise, as per the "Y" branch, continue in Stage 3C as per 1513). Once the system is in the hybrid mode of operation, it will continually check whether the temperature of the liquid entering the data center system is higher than a minimum temperature ($T_2$), as per decision block 1514 (if higher than minimum, keep checking as per "N" branch of block 1514). If not, as per the "Y" branch of decision block 1514, either of the other two modes will be activated based on the outdoor air and ground temperature. In particular, if the ground temperature is not less than the outside temperature, as per the "N" branch of decision block 1516, proceed to step 1510; otherwise, proceed to step 1518 via the "Y" branch of block 1516. The switching between different modes of operation can take place N number of times a year depending upon location of the system, weather conditions of the location, and other environmental factors.

Figure 16:
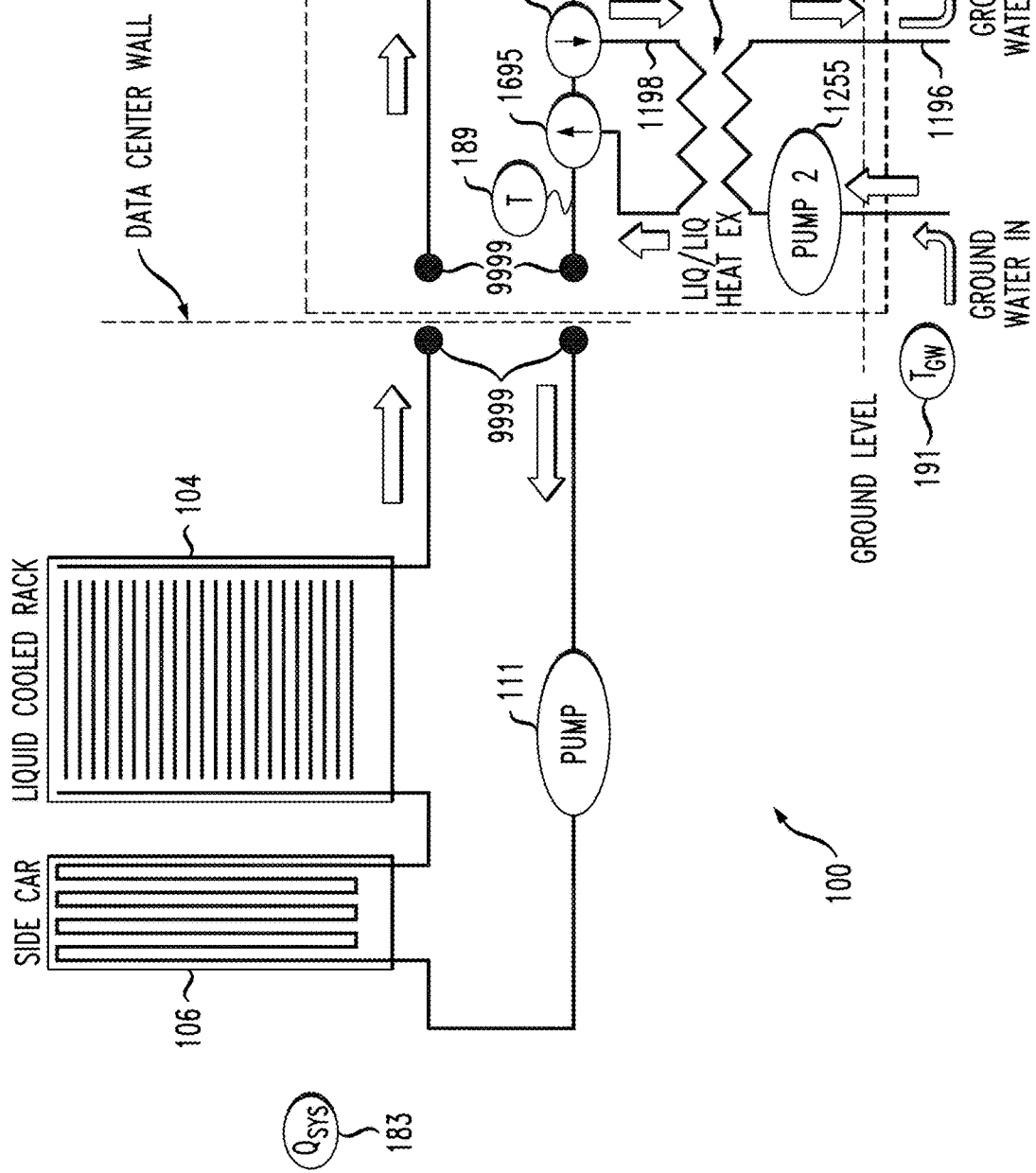
FIG. 16 shows yet another exemplary data center liquid cooling system, according to an aspect of the invention.

FIG. 16 shows another alternative embodiment in a series arrangement in a liquid cooled data center with an air side outdoor heat exchanger. The system being cooled includes a liquid cooled rack 104 and a side car segment 106 and is present inside the data center. The liquid pump 111 can either be placed inside the data center unit or outside. Similar to the previous design, the geothermal loop 1199 in this particular configuration uses the ground water for dissipating the system heat to the surroundings. The geothermal loop is connected to the ambient air cooling loop 1197 in a series arrangement with the help of three-way valves 1693, 1695. These three-way valves can be computer controlled. In case of computer controlled three-way valves, the outside air temperature, the ground temperature and the temperature of the liquid entering the data center system can be used as control parameters for the three-way valve control technique. The working of this particular implementation is schematically explained through FIGS. 17-20. As noted above, in a preferred approach, there are two temperature sensors—one at the inlet to the outside air heat exchanger and the other at the outlet from the outside air heat exchanger. These two sensors will be used to monitor the amount of heat dissipated to the outside air through the heat exchanger. Also based on this information the position of the three-way valve can be controlled.

Non-limiting examples of coolants include water and glycol. FIG. 16 represents an open loop geothermal cooling series arrangement. Geothermal coil 187 is used to dissipate heat below ground level. In at least some cases, groundwater is taken from at least 2 m below ground level. The ground level temperature may vary, for example, from about 42 F to about 80 F, depending on location. See discussion with respect to FIG. 34 below.

Figure 17:
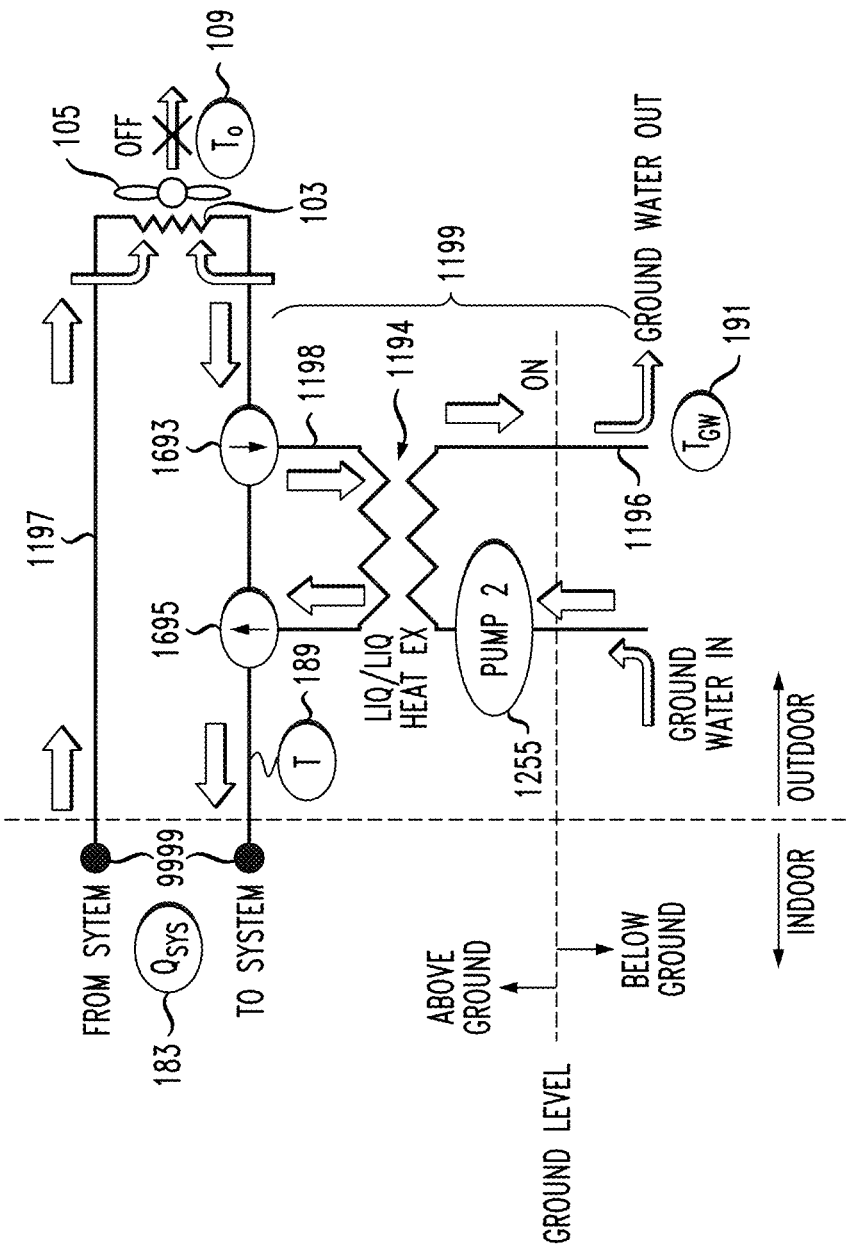
FIGS. 17-19 show four stages in operation of the system of FIG. 16.

FIG. 17 represents Stage 4A in which only the geothermal loop 1199 is active and the ambient air cooling loop 1197 is inactive. Pump-2 1255 is ON, the outside heat exchanger 103 (and fan 105 if present) is/are OFF and the three-way valves are completely turned so as to allow flow through the geothermal loop.

Figure 18:
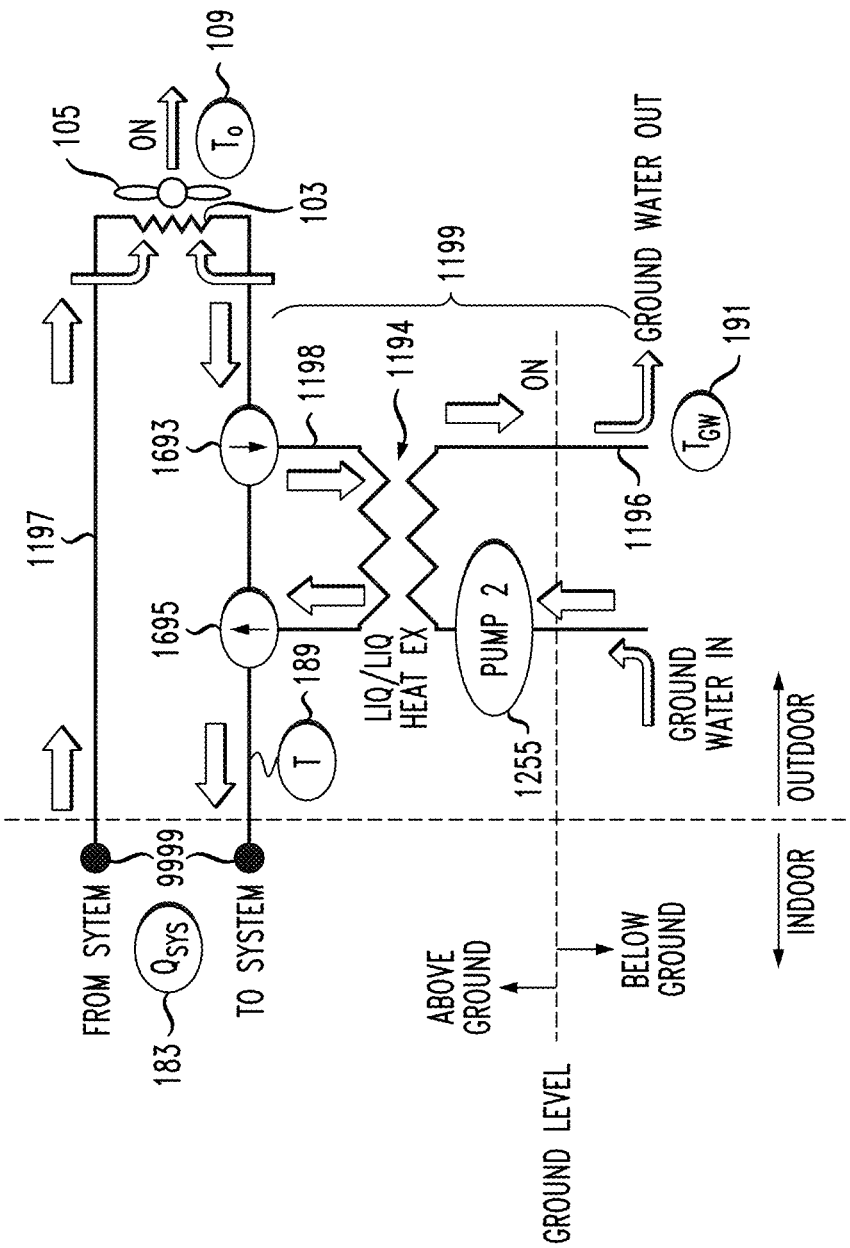

FIG. 18 represents Stage 4B in which both the geothermal cooling and ambient air cooling loops are active. Pump-2 1255 is ON, the outside heat exchanger 103 (and fan 105 if present) is/are ON and the three-way valves are completely turned so as to allow flow through both the geothermal and ambient air cooling loops.

Figure 19:
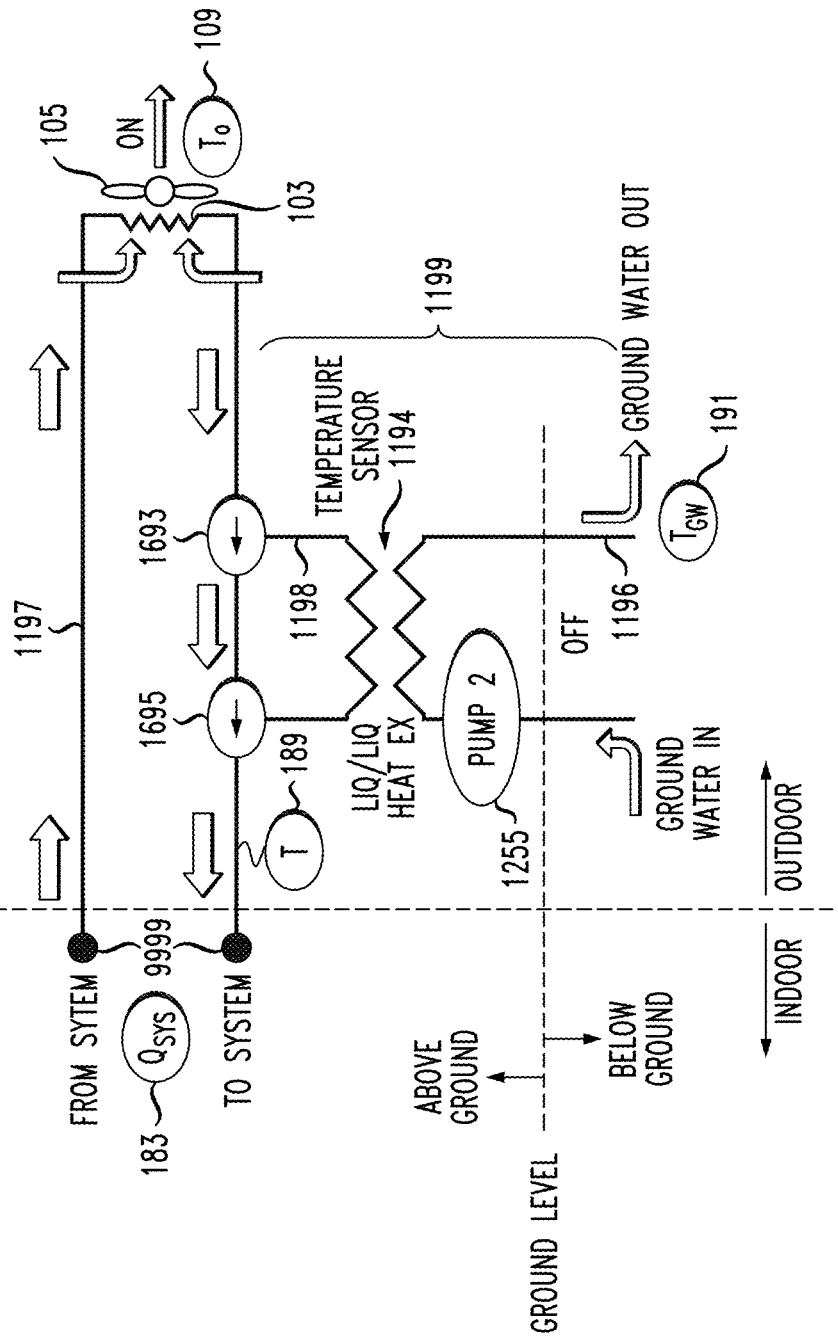

FIG. 19 represents Stage 4C in which only the ambient air cooling loop is active and the geothermal loop is inactive. The outside heat exchanger 103 (and fan 105 if present) is/are ON and the three-way valves are completely turned to stop the flow through the geothermal cooling loop and to allow flow only through the ambient air cooling loop. Since there no flow through the geothermal loop, Pump-2 1255 remains OFF.

Figure 20:
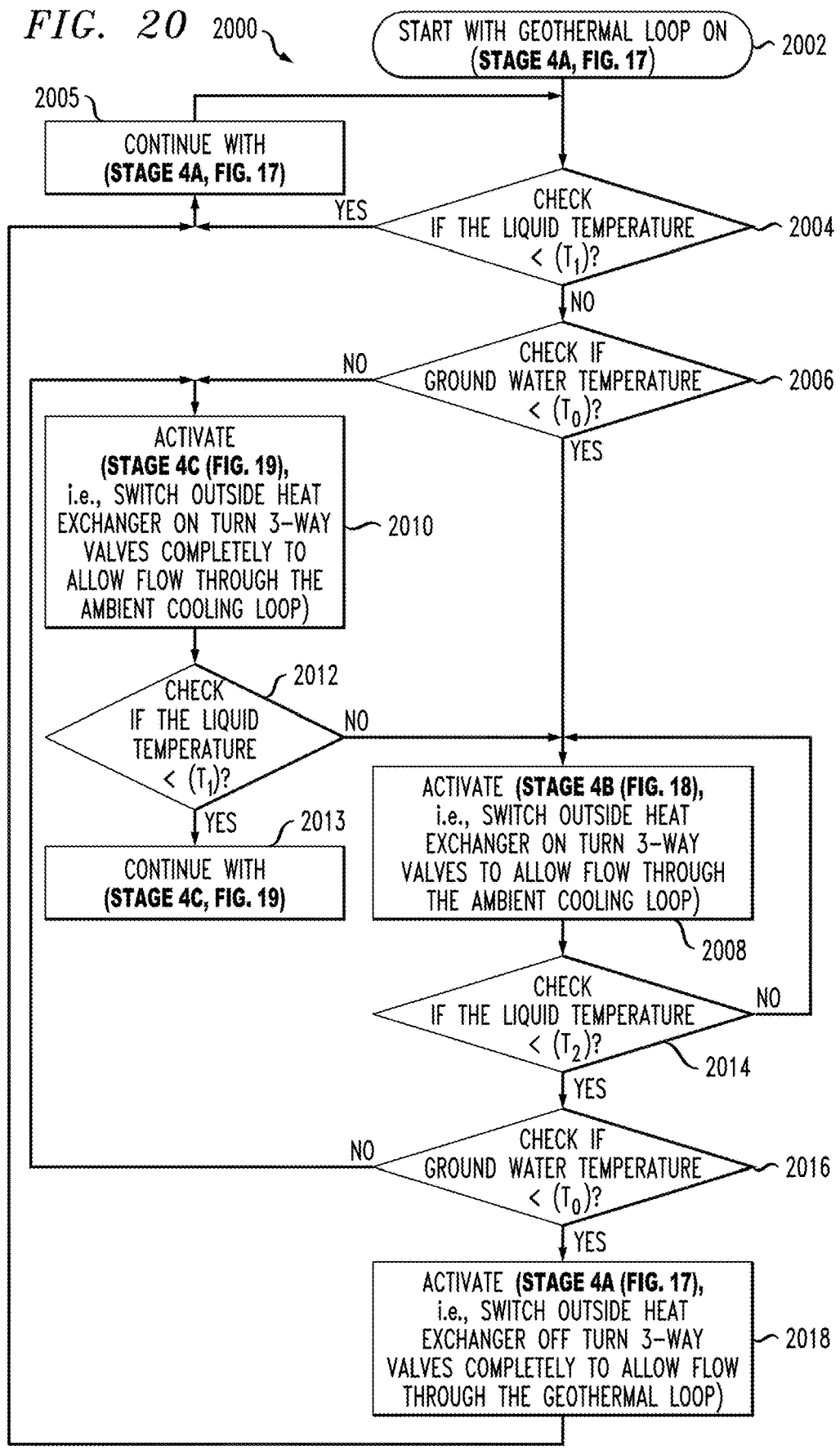
FIG. 20 shows a flow chart for operation of the system of FIG. 16.

FIG. 20 is a flowchart 2000 that illustrates an exemplary operational technique for the embodiment of FIGS. 16-19. The cooling system can be initiated from any stage, however for simplicity; Stage 4A (FIG. 17) is represented as the initial state of the cooling system, as per step 2002. The outdoor air temperature, the ground temperature and the temperature of the liquid entering the data center system are constantly monitored and based on these temperatures, different stages can be activated. When the temperature of the liquid entering the data center is higher than the maximum allowed temperature ($T_1$) ("N" branch of decision block 2004), the geothermal loop only is not capable of dissipating the heat to the surroundings and the cooling system requires a different stage of operation (otherwise, as per the "Y" branch, continue in Stage 4A as per 2005). In this situation, a check is made whether the outside air temperature is higher than the ground temperature, as at decision block 2006. If yes, as per the "Y" branch of block 2006, the ambient air cooling loop will also be activated (that is, Stage 4B, FIG. 18), as per step 2008. If no, as per the "N" branch of decision block 2006, the ambient air cooling loop will be activated and the geothermal loop will be deactivated (that is, Stage 4C, FIG. 19), as per step 2010. If at this stage, the temperature of the liquid entering the data center is higher than the maximum allowed temperature ($T_1$), as per the "N" branch of decision block 2012, then, the ambient air cooling loop only is also not capable of dissipating the heat to the surrounding and the cooling system requires the dual stage of operation (that is, Stage 4B, FIG. 18), as per step 2008 (otherwise, as per the "Y" branch, continue in Stage 4C as per 2013). Once the system is in hybrid mode of operation, it will continually check whether the temperature of the liquid entering the data center system is higher than a minimum temperature ($T_2$), as per decision block 2014 (if higher than minimum, keep checking as per "N" branch of block 2014). If not, as per the "Y" branch of decision block 2014, either of the other two modes will be activated based on the outdoor air and ground temperature. In particular, if the ground temperature is not less than the outside temperature, as per the "N" branch of decision block 2016, proceed to step 2010; otherwise, proceed to step 2018 via the "Y" branch of block 2016. The switching between different modes of operation can take place N number of times a year depending upon location of the system, weather conditions of the location, and other environmental factors.

Figure 21:
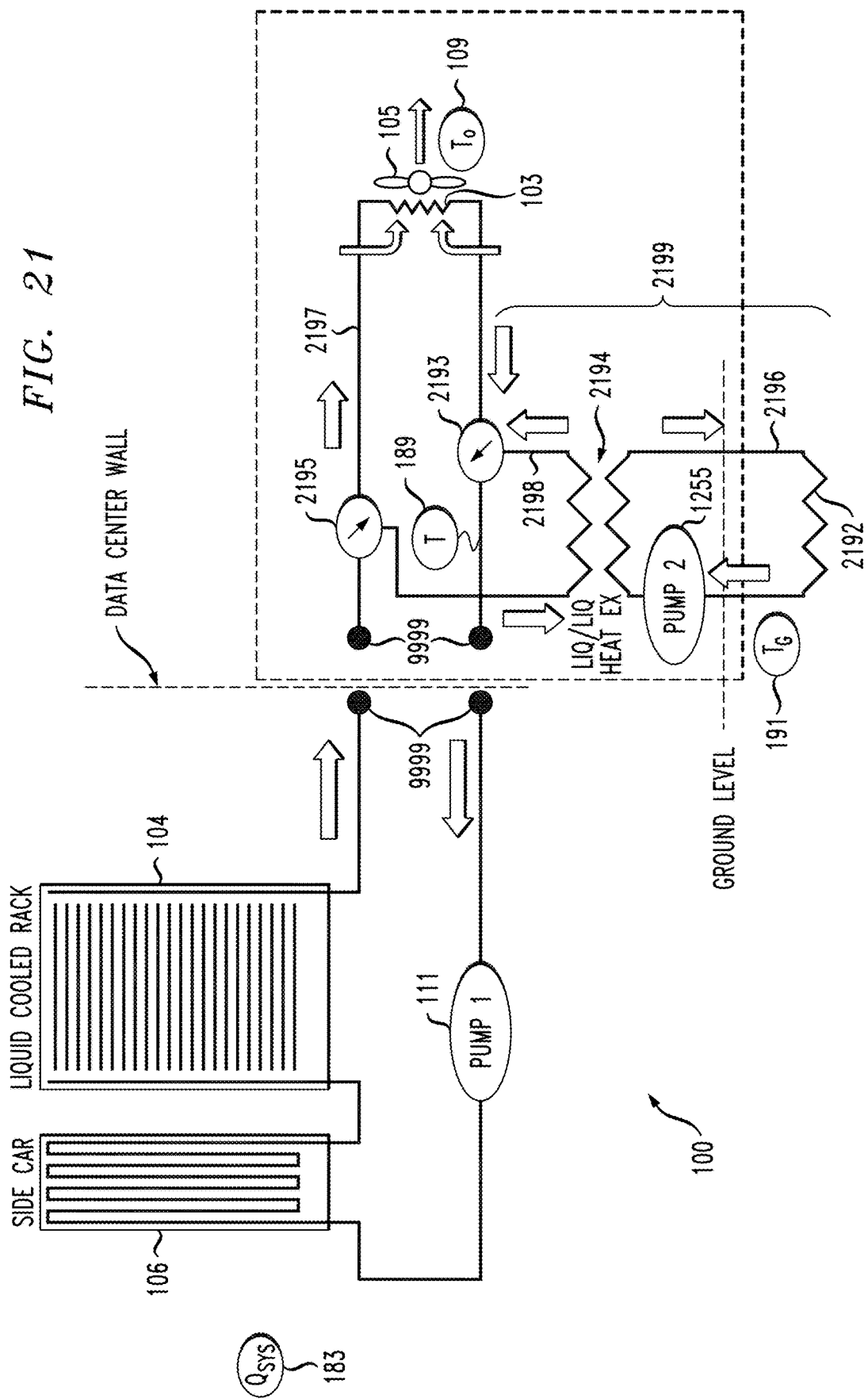
FIG. 21 shows a further exemplary data center liquid cooling system, according to an aspect of the invention.

FIG. 21 shows another alternative embodiment in a liquid cooled data center with an air side outdoor heat exchanger. The system being cooled includes a liquid cooled rack 104 and a side car segment 106 and is present inside the data center. The liquid pump 111 can either be placed inside the data center unit or outside. The geothermal loop 2199 in this particular configuration uses a separate liquid loop 2196 for dissipating the system heat to the surroundings. The geothermal loop is connected to the ambient air cooling loop 2197 in a parallel arrangement with the help of three-way valves 2193, 2195. The liquid in the loop 2196 could be different from the liquid in the system cooling loop. The three-way valves can be computer controlled. In the case of computer controlled three-way valves, the outside air temperature, the ground temperature and the temperature of the liquid entering the data center system can be used as control parameters for the three-way valve control technique. Note that geothermal loop 2199 includes upper loop 2198 and lower (ground) loop 2196 thermally coupled by liquid-to-liquid heat exchanger 2194. The lower loop includes heat exchanger 2192 to reject heat to the ground temperature. The working of this particular implementation is schematically explained through FIGS. 22-25. Please note reference character 191 is used herein for both the ground temperature sensor and ground water temperature sensor.

Non-limiting examples of coolants include water and glycol. FIG. 21 represents a closed loop geothermal cooling parallel arrangement. Geothermal coil 2192 is used to dissipate heat below ground level. In at least some cases, coil 2192 is at least 2 m below ground level. The ground level temperature may vary, for example, from about 42 F to about 80 F, depending on location. See discussion with respect to FIG. 34 below.

Figure 22:
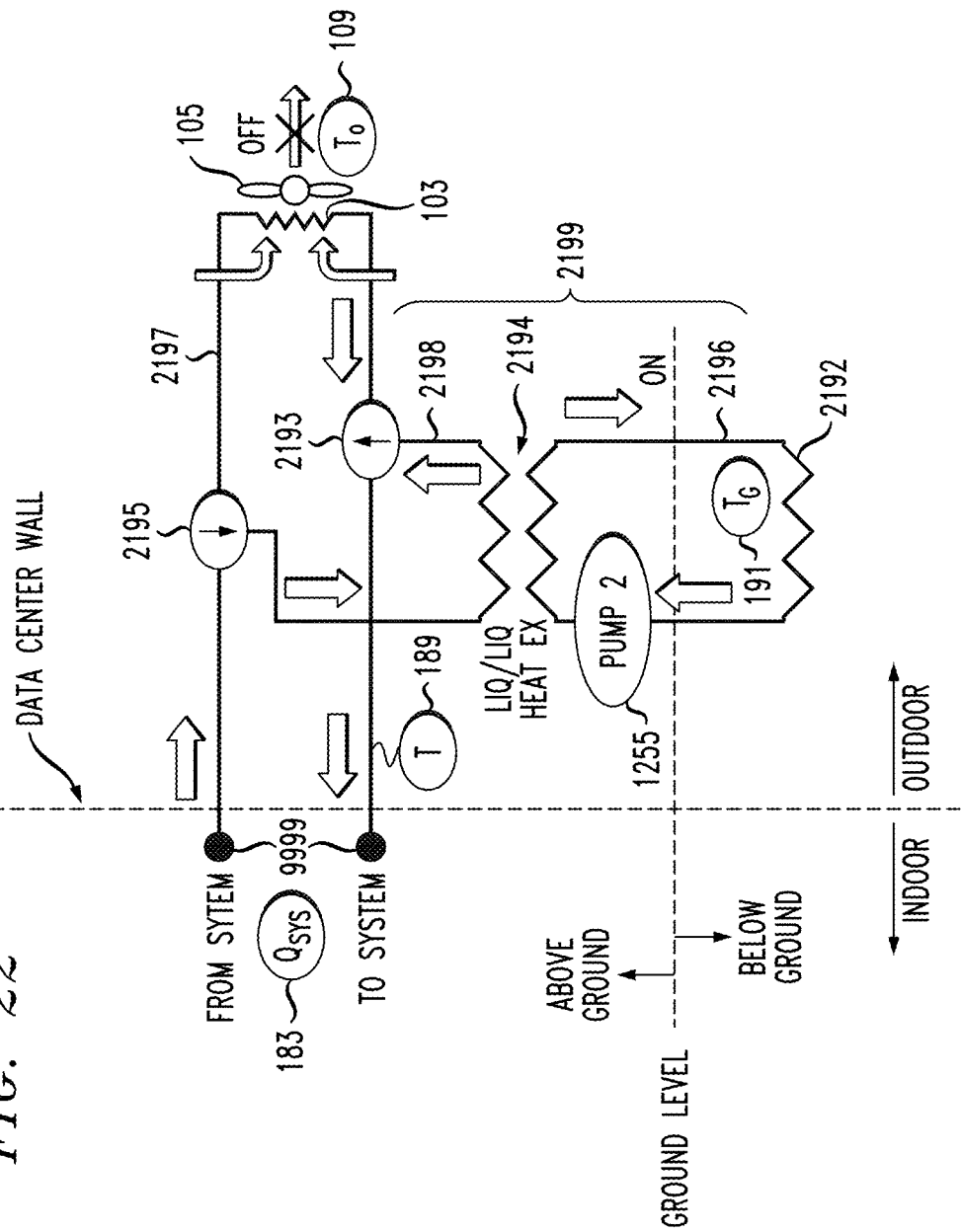
FIGS. 22-24 show four stages in operation of the system of FIG. 21.

FIG. 22 represents Stage 5A in which only the geothermal loop is active and the ambient air cooling loop is inactive. Pump-2 1255 is ON, the outside heat exchanger 103 (and fan 105 if present) is/are OFF and the three-way valves are completely turned so as to allow flow only through the geothermal loop.

Figure 23:
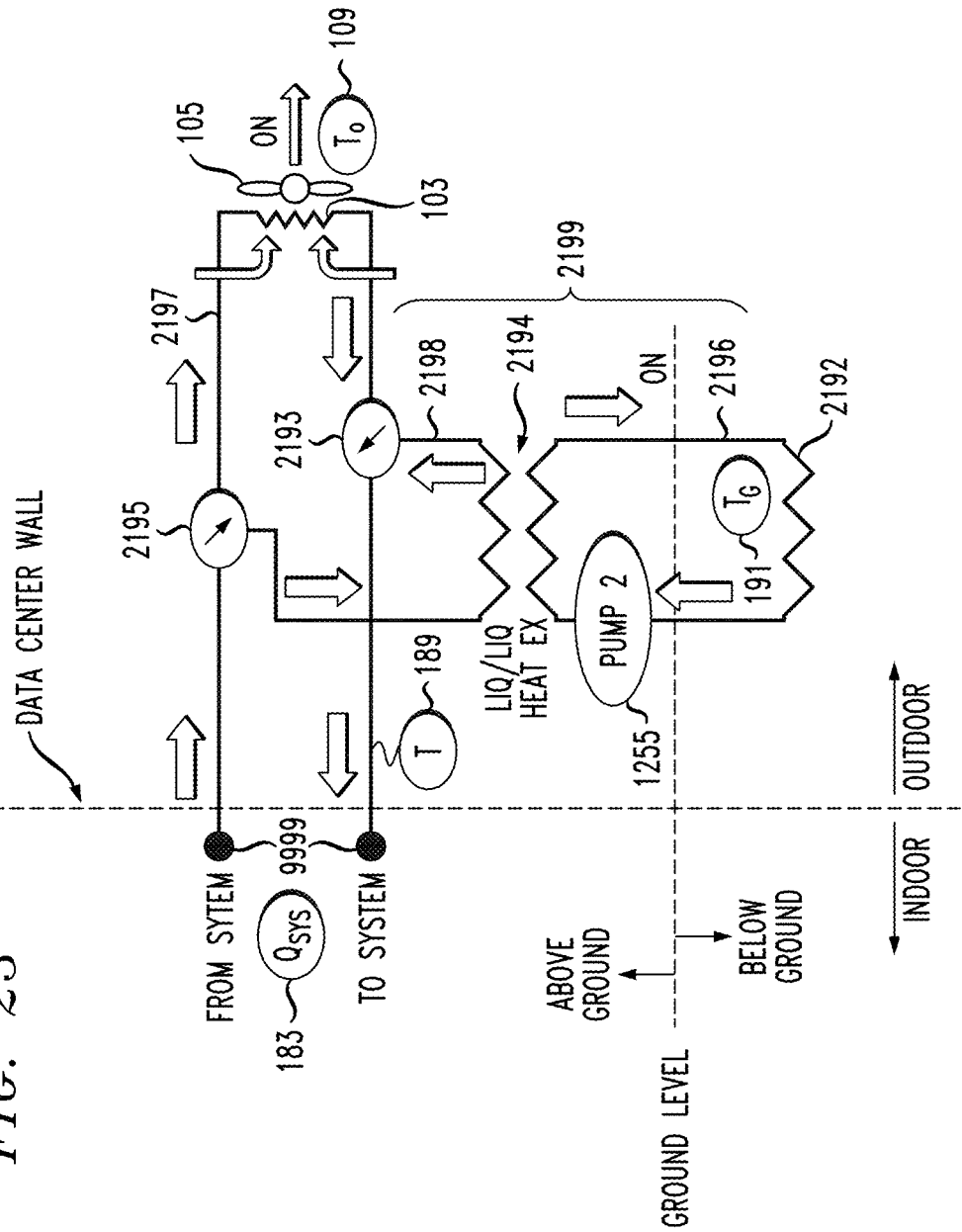

FIG. 23 represents Stage 5B in which both the geothermal cooling and ambient air cooling loops are active. Pump-2 1255 is ON, the outside heat exchanger 103 (and fan 105 if present) is/are ON and the three-way valves are partially turned so as to allow flow through both the geothermal and ambient air cooling loops.

Figure 24:
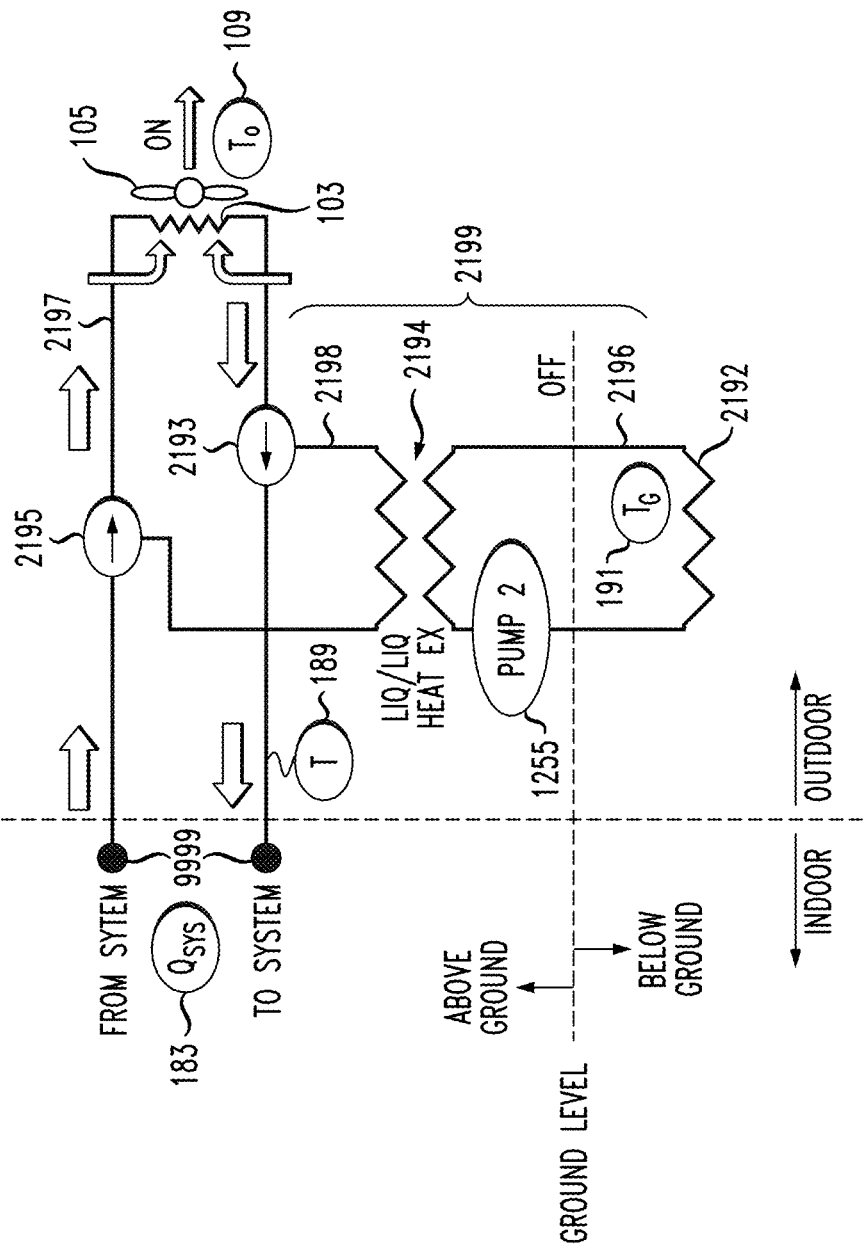

FIG. 24 represents Stage 5C in which only the ambient air cooling loop is active and the geothermal loop is inactive. The outside heat exchanger 103 (and fan 105 if present) is/are ON and the three-way valves are completely turned to allow flow only through the ambient air cooling loop. Since there no flow through the geothermal loop, Pump-2 1255 remains OFF.

Figure 25:
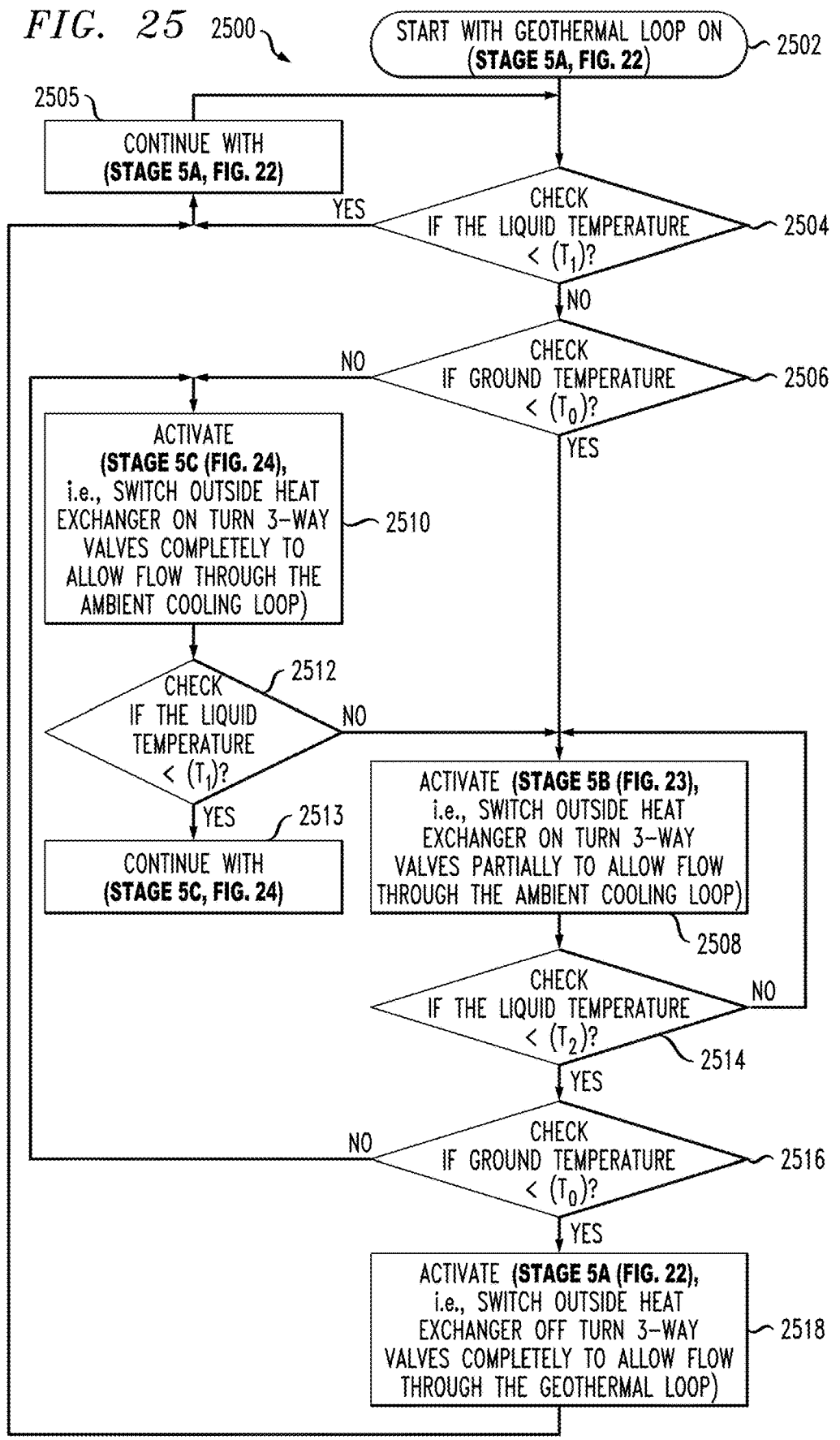
FIG. 25 shows a flow chart for operation of the system of FIG. 21.

FIG. 25 is a flowchart 2500 that illustrates an exemplary operational technique for the embodiment of FIGS. 21-24. The cooling system can be initiated from any stage, however for simplicity; Stage 5A (FIG. 22) is represented as the initial state of the cooling system, as per step 2502. The outdoor air temperature, the ground temperature and the temperature of the liquid entering the data center system are constantly monitored and based on these temperatures, different stages can be activated. When the temperature of the liquid entering the data center is higher than the maximum allowed temperature ($T_1$), as per the "N" branch of decision block 2504, the geothermal loop only is not capable of dissipating the heat to the surroundings and the cooling system requires a different stage of operation (otherwise, as per the "Y" branch, continue in Stage 5A as per 2505). In this situation, a check is made whether the outside air temperature is higher than the ground temperature, as per decision block 2506. If yes, as per the "Y" branch of decision block 2506, the ambient air cooling loop will also be activated (that is, Stage 5B, FIG. 23), as per step 2508. If No, as per the "N" branch of decision block 2506, the ambient air cooling loop will be activated and the geothermal loop will be deactivated (that is, Stage 5C, FIG. 24), as per step 2510. If at this stage, the temperature of the liquid entering the data center is higher than the maximum allowed temperature ($T_1$), as per the "N" branch of block 2512, then the ambient air cooling loop only is also not capable of dissipating the heat to the surrounding and the cooling system requires the dual stage of operation (that is, Stage 5B, FIG. 23), as per step 2508 (otherwise, as per the "Y" branch, continue in Stage 5C as per 2513). Once the system is in the hybrid mode of operation, it will continually check whether the temperature of the liquid entering the data center system is higher than a minimum temperature ($T_2$), as per decision block 2514 (if higher than minimum, keep checking as per "N" branch of block 2514). If not, as per the "Y" branch of decision block 2514, either of the other two modes will be activated based on the outdoor air and ground temperature. In particular, if the ground temperature is not less than the outside temperature, as per the "N" branch of decision block 2516, proceed to step 2510; otherwise, proceed to step 2518 via the "Y" branch of block 2516. The switching between different modes of operation can take place N number of times a year depending upon location of the system, weather conditions of the location, and other environmental factors.

Figure 26:
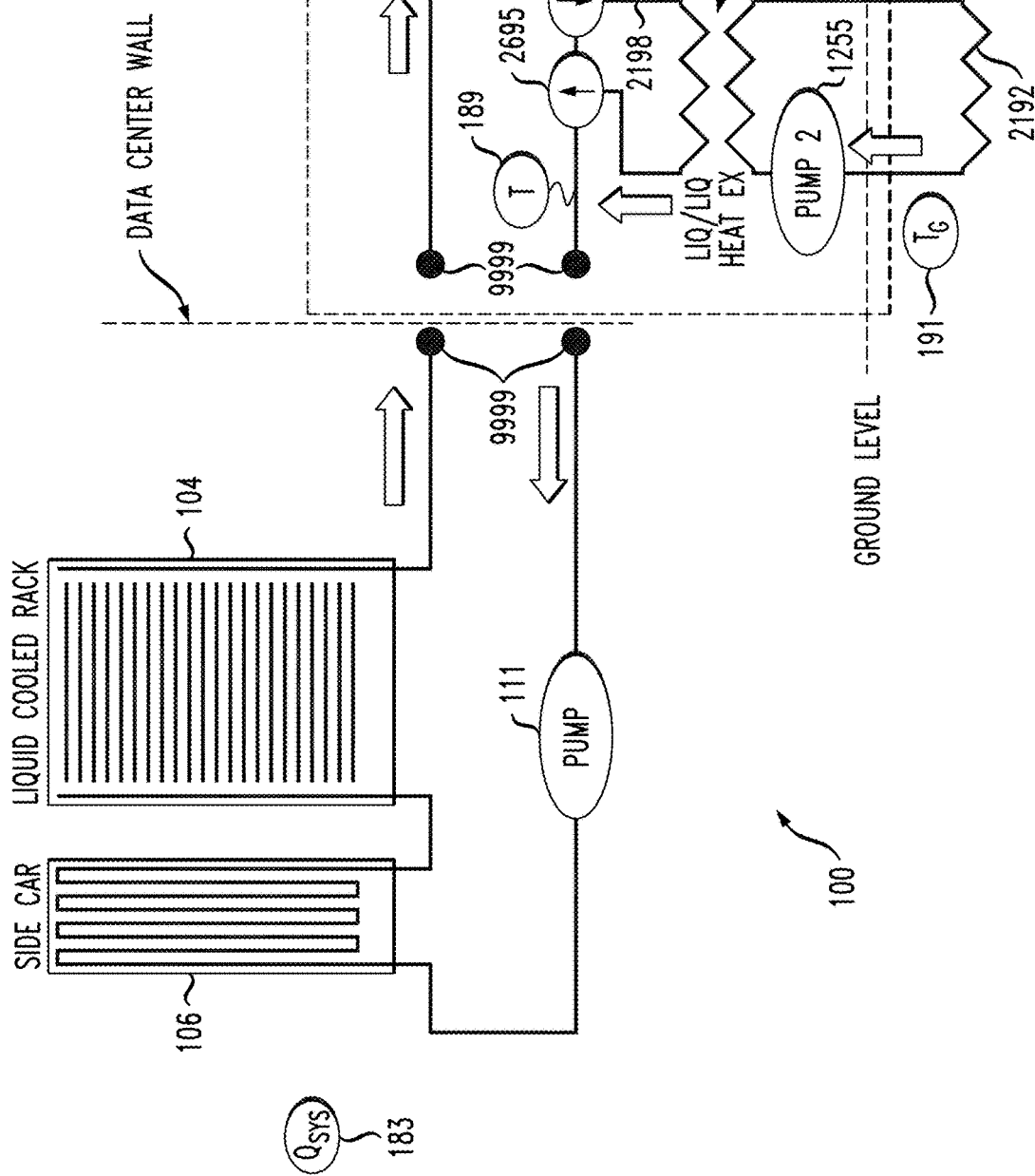
FIG. 26 shows a still further exemplary data center liquid cooling system, according to an aspect of the invention.

FIG. 26 shows another alternative embodiment in a liquid cooled data center in a series arrangement with an air side outdoor heat exchanger. The system being cooled includes a liquid cooled rack 104 and a side car segment 106 and is present inside the data center. The liquid pump 111 can either be placed inside the data center unit or outside. Similar to the previous design, the geothermal loop 2199 in this particular configuration uses a separate liquid loop 2196 for dissipating the system heat to the surroundings. The geothermal loop and is connected to the ambient air cooling loop 2197 in a series arrangement with the help of 3-way valves 2693, 2695. The liquid in the loop 2196 could be different from the liquid in the system cooling loop. These three-way valves can be computer controlled. In case of computer controlled three-way valves, the outside air temperature, the ground temperature and the temperature of the liquid entering the data center system can be used as control parameters for the three-way valve control technique. The working of this particular implementation is schematically explained through FIGS. 27-30.

Non-limiting examples of coolants include water and glycol. FIG. 26 represents a closed loop geothermal cooling series arrangement. Geothermal coil 2192 is used to dissipate heat below ground level. In at least some cases, coil 2192 is at least 2 m below ground level. The ground level temperature may vary, for example, from about 42 F to about 80 F, depending on location. See discussion with respect to FIG. 34 below.

Figure 27:
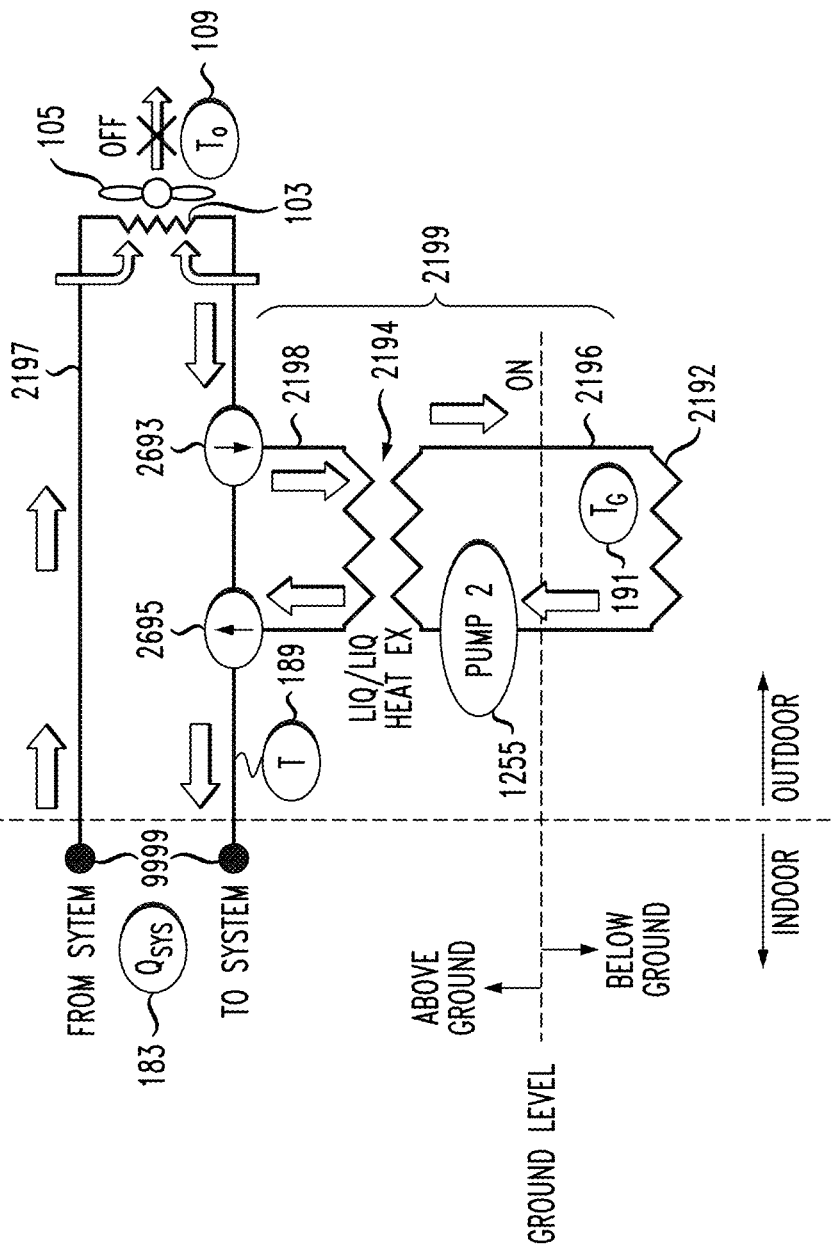
FIGS. 27-29 show four stages in operation of the system of FIG. 26.

FIG. 27 represents Stage 6A in which only the geothermal loop is active and the ambient air cooling loop is inactive. Pump-2 1255 is ON, the outside heat exchanger is OFF and the three-way valves are completely turned so as to allow flow through the geothermal loop.

Figure 28:
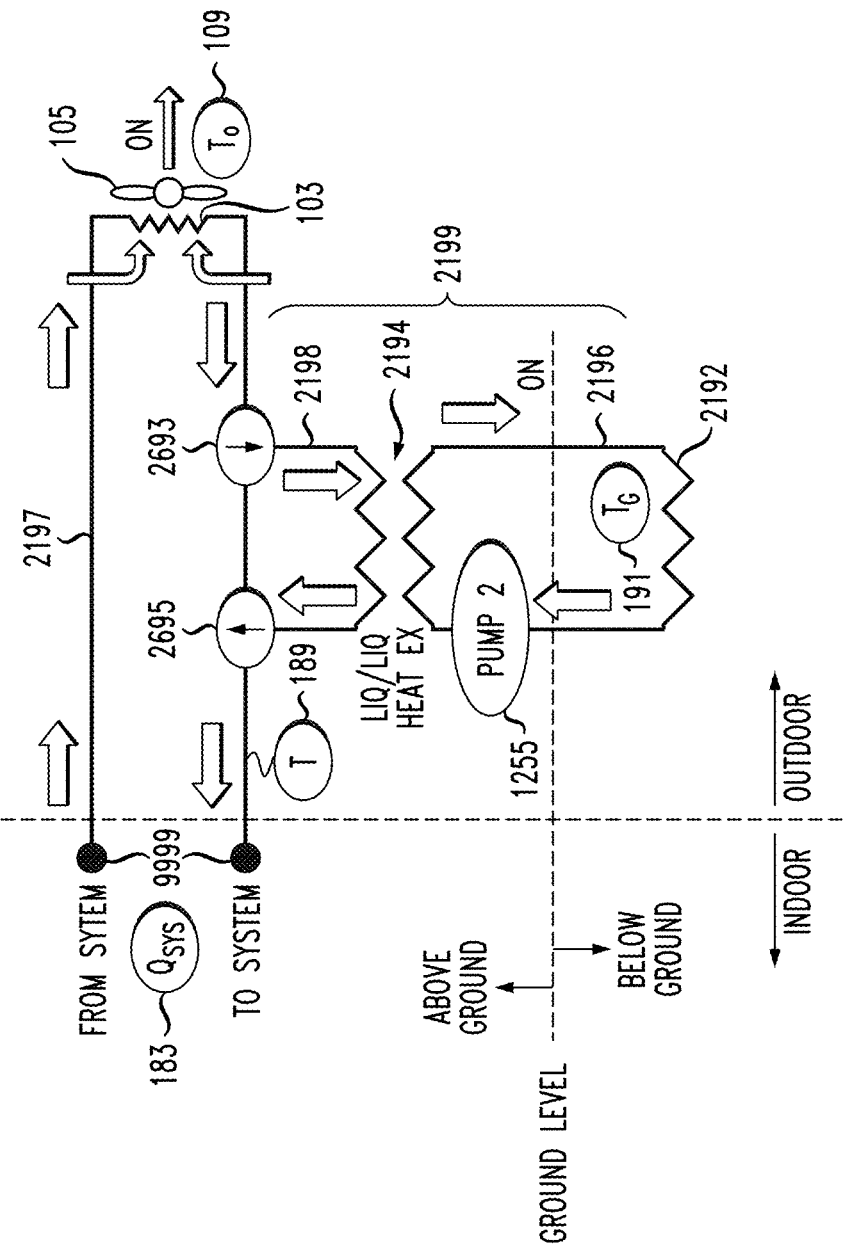

FIG. 28 represents Stage 6B in which both the geothermal cooling and ambient air cooling loops are active. Pump-2 1255 is ON, the outside heat exchanger is ON and the three-way valves are completely turned so as to allow flow through both the geothermal as well as ambient air cooling loop.

Figure 29:
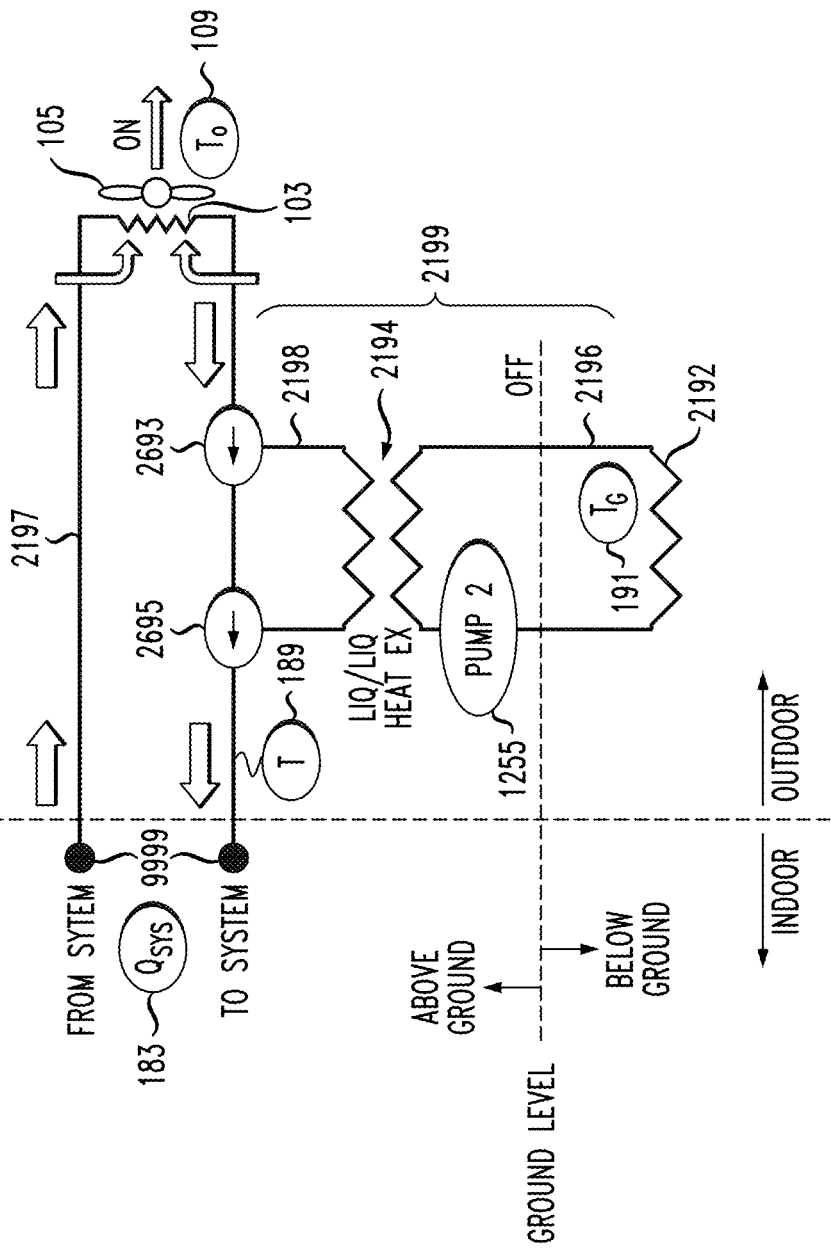

FIG. 29 represents Stage 6C in which only the ambient air cooling loop is active and the geothermal loop is inactive. The outside heat exchanger is ON and the three-way valves are completely turned to stop the flow through the geothermal cooling loop and to allow flow only through the ambient air cooling loop. Since there no flow through the geothermal loop, Pump-2 1255 remains OFF.

Figure 30:
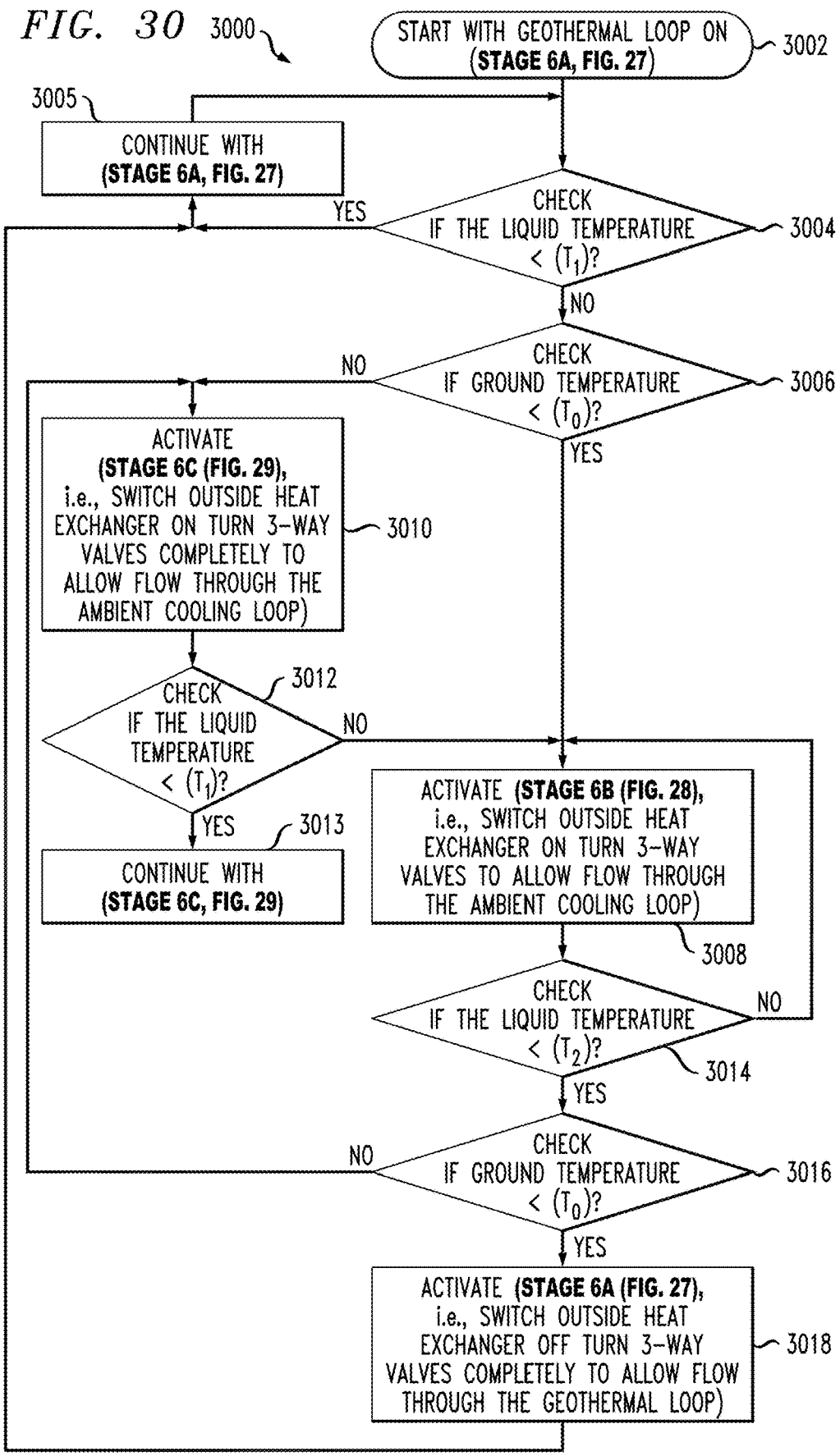
FIG. 30 shows a flow chart for operation of the system of FIG. 26.

FIG. 30 is a flowchart 3000 that illustrates an exemplary operational technique for the embodiment of FIGS. 26-29. The cooling system can be initiated from any stage, however for simplicity; Stage 6A (FIG. 27) is represented as the initial state of the cooling system, as per step 3002. The outdoor air temperature, the ground temperature and the temperature of the liquid entering the data center system are constantly monitored and based on these temperatures, different stages can be activated. When the temperature of the liquid entering the data center is higher than the maximum allowed temperature ($T_1$), as per the "N" branch of decision block 3004, the geothermal loop only is not capable of dissipating the heat to the surroundings and the cooling system requires a different stage of operation (otherwise, as per the "Y" branch, continue in Stage 6A as per 3005). In this situation, a check is made whether the outside air temperature is higher than the ground temperature, as per decision block 3006. If yes, as per the "Y" branch of decision block 3006, the ambient air cooling loop will also be activated (that is, Stage 6B, FIG. 28), as per step 3008. If No, as per the "N" branch of decision block 3006, the ambient air cooling loop will be activated and the geothermal loop will be deactivated (that is, Stage 6C, FIG. 29), as per step 3010. If at this stage, the temperature of the liquid entering the data center is higher than the maximum allowed temperature ($T_1$), as per the "N" branch of block 3012, then the ambient air cooling loop only is also not capable of dissipating the heat to the surrounding and the cooling system requires the dual stage of operation (that is, Stage 6B, FIG. 28), as per step 3008 (otherwise, as per the "Y" branch of block 3012, continue in Stage 6C as per 3013). Once the system is in the hybrid mode of operation, it will continually check whether the temperature of the liquid entering the data center system is higher than a minimum temperature ($T_2$), as per decision block 3014 (if higher than minimum, keep checking as per "N" branch of block 3014). If not, as per the "Y" branch of decision block 3014, either of the other two modes will be activated based on the outdoor air and ground temperature. In particular, if the ground temperature is not less than the outside temperature, as per the "N" branch of decision block 3016, proceed to step 3010; otherwise, proceed to step 3018 via the "Y" branch of block 3016. The switching between different modes of operation can take place N number of times a year depending upon location of the system, weather conditions of the location, and other environmental factors.

Figure 31:
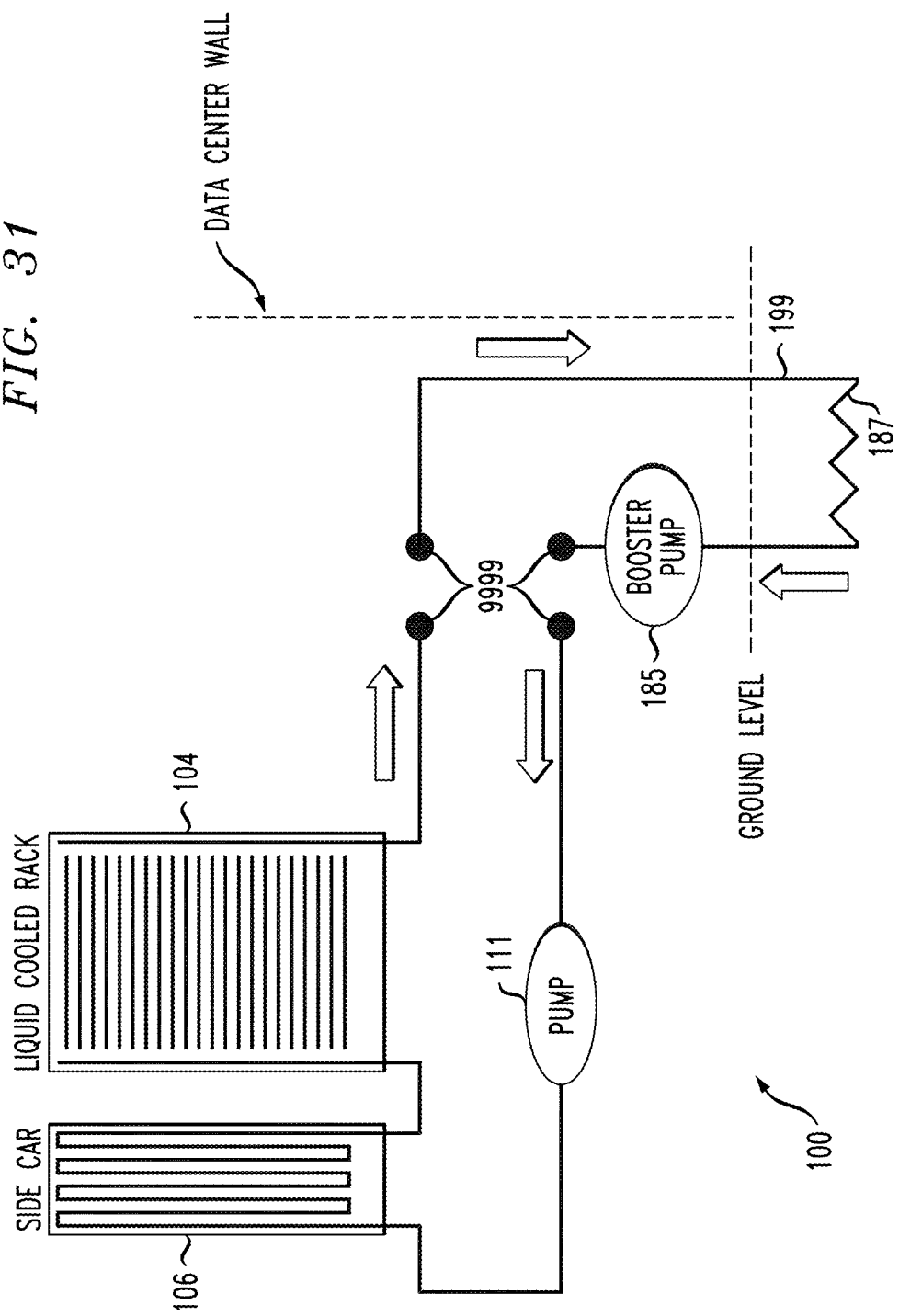
FIGS. 31-33 show three even further exemplary data center liquid cooling systems, according to aspects of the invention.
Figure 32:
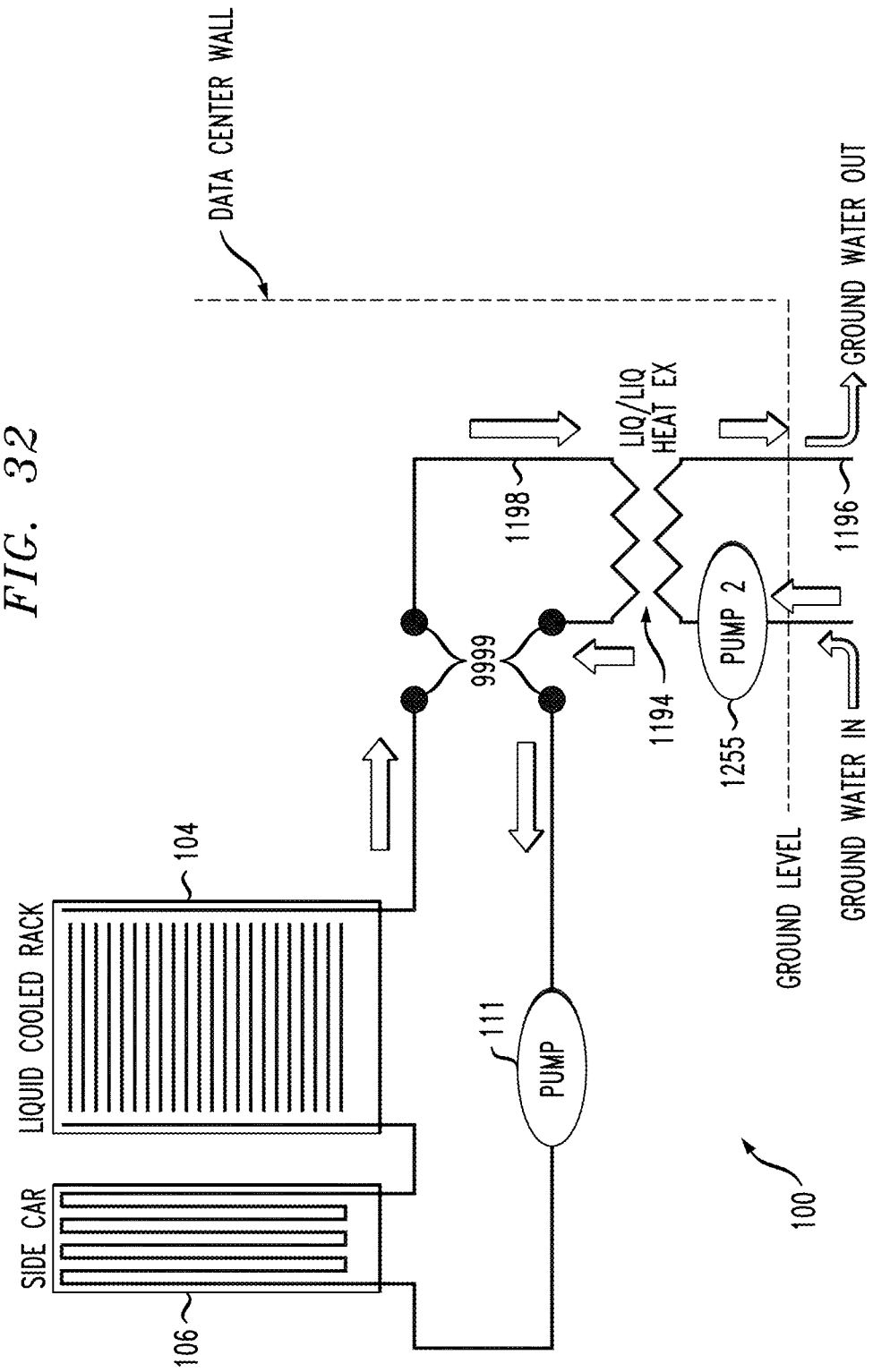
Figure 33:
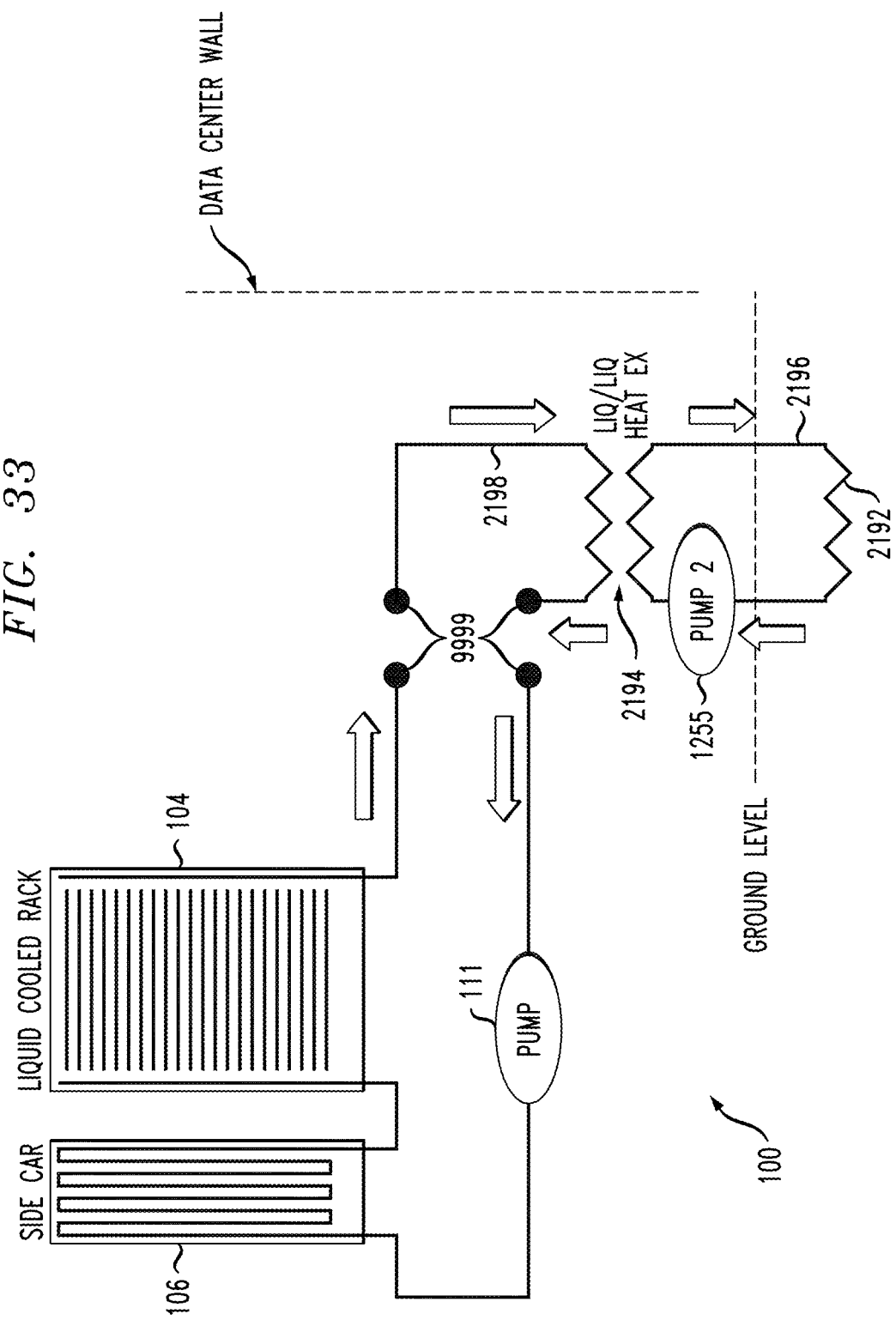

In addition to the above-described ambient air cooling with geothermal enhancement designs, completely geothermal-based liquid cooled data center designs are also possible. FIG. 31 represents a closed loop geothermal cooling scheme. FIG. 32 represents an open loop ground water-based geothermal cooling loop design. FIG. 33 represents another closed loop geothermal cooling design that uses a separate liquid loop 2196 for dissipating the system heat to the surroundings. The liquid in the loop 2196 could be different from the liquid in the system cooling loop. In FIGS. 31-33, the pumps and the geothermal loops operate continuously, whenever cooling of the data center is required. Non-limiting examples of coolants include water and glycol, in FIGS. 31-33 (and in the other figures, as discussed elsewhere).

Figure 34:
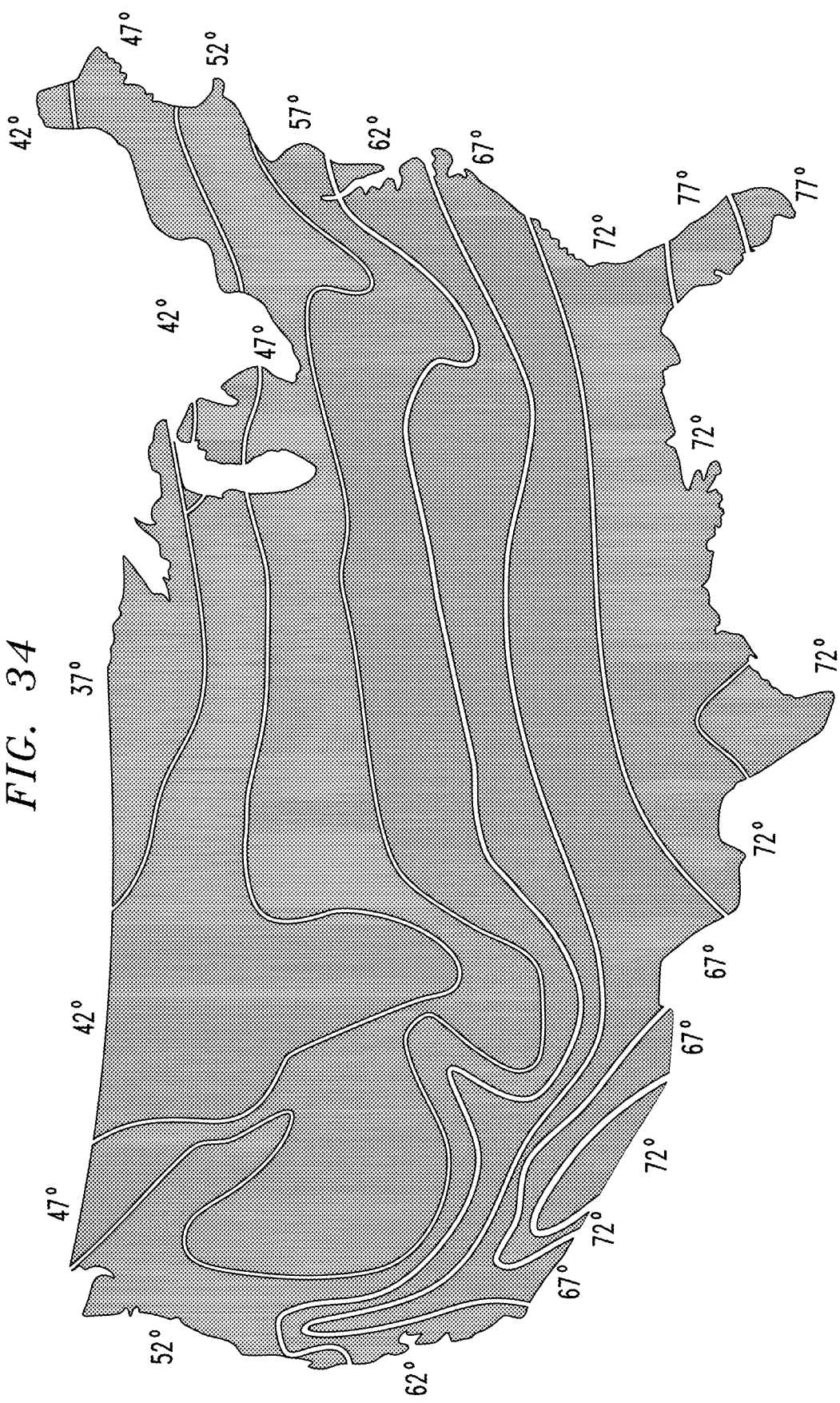
FIG. 34 shows US average ground water temperature.

FIG. 34 shows a typical year round average ground water temperature map for the US, in degrees Fahrenheit. Similar data is available for other locations around the world. Fahrenheit can be converted to SI (Centigrade) by first subtracting 32 and then multiplying the result by ⅝.

For the avoidance of doubt, the outdoor economizer portions depicted in the figures include a heat exchanger 103 and a fan 105. However, some embodiments could employ outdoor heat exchanger portions without fans. An "outdoor heat exchanger portion" is intended to encompass both an outdoor heat exchanger with a fan (economizer) and an outdoor heat exchanger without a fan.

One or more embodiments advantageously provide an auxiliary geothermal loop for cooling of data centers.

Aspects of the invention include a method for providing cooling in a data center cooling system, including providing a data center cooling system having a geothermal cooling loop and a heat exchanger loop; monitoring outside air temperature, ground temperature and temperature of a liquid in the data center system; and selectively operating at least one of the geothermal cooling loop and the heat exchanger loop based on the monitored temperatures.

Aspects of the invention also include a system for providing cooling in a data center including a geothermal cooling loop; a heat exchanger cooling loop; a plurality of temperature sensors for monitoring outside air temperature, ground temperature and temperature of a liquid at least one of the cooling loops; and a controller for selectively operating at least one of the geothermal cooling loop and the heat exchanger loop based on the monitored temperatures.

One or more embodiments provide one, some, or all of:
Free cooling using air-side economizer with geothermal assist.
Single loop mode where the coolant entering the rack also passes through the geothermal loop when the geothermal cooling loop is active. In other words, free cooling without modular coolant distribution units.
Monitoring outside air temperature, ground temperature and temperature of a liquid in the data center and heat dissipation from the rack; and selectively operating at least one of the geothermal cooling loop and the heat exchanger loop based on the monitored temperatures.
A system for providing cooling in a data center including a geothermal cooling loop; a heat exchanger cooling loop; a plurality of temperature sensors for monitoring outside air temperature, ground temperature, temperature of a liquid at least one of the cooling loops and heat dissipation from the electronics rack; and a controller for selectively operating at least one of the geothermal cooling loop and the heat exchanger loop based on the monitored temperatures.

Again, one or more embodiments provide free cooling (e.g., of electronic racks) with geothermal assist and/or selective operation based on monitored temperatures.

In one or more embodiments, the IT infrastructure that needs to be cooled remains stationary, above ground, in a conventional data center, while the coolant, removing the heat from the IT infrastructure, rejects the heat to the cooler underground via a geothermal cooling loop.

Given the discussion thus far, it will be appreciated that, in general terms, an exemplary method (see, e.g., FIGS. 5, 10, 15, 20, 25, 30), according to an aspect of the invention, includes the step of operating a data center cooling system in a first mode. The data center cooling system has an indoor portion 100 wherein heat is absorbed from components 104, 106 in the data center by a heat transfer fluid. The data center cooling system has an outdoor heat exchanger portion 103 in loops 197, 1197, 2197 and a geothermal heat exchanger portion 199, 1199, 2199.

The first mode includes ambient air cooling of the heat transfer fluid in the outdoor heat exchanger portion and/or geothermal cooling of the heat transfer fluid in the geothermal heat exchanger portion. A determination is made, based on an appropriate metric, that a switch should be made from the first mode to a second mode. Responsive to such determination, the data center cooling system is switched to the second mode. The second mode is different than the first mode. The possibilities are as follows:

if the first mode is geothermal only, the second mode is air only or air plus geothermal if the first mode is air only, the second mode is geothermal only or air plus geothermal if the first mode is air plus geothermal, the second mode is air only or geothermal only In some cases, the determining step includes determining based on at least one of time, heat dissipation from the components, outdoor air temperature, ground heat sink temperature, and temperature of the heat transfer fluid at a predetermined point (e.g., where it enters the data center as per 189). As used herein, ground heat sink temperature refers to the ground or ground water temperature as the case may be.

In some cases, the first mode includes geothermal cooling of the heat transfer fluid in the geothermal heat exchanger portion only, as per 502, 1002, 1502, 2002, 2502, and 3002. The determining step includes comparing the temperature of the heat transfer fluid at the predetermined point to a maximum allowable value, as at 504, 1004, 1504, 2004, 2504, and 3004. The second mode includes at least the ambient air cooling of the heat transfer fluid in the outdoor heat exchanger portion (e.g., proceed to 510, 1010, 1510, 2010, 2510, 3010 for ambient air cooling only, or proceed to 516, 1016, 1508, 2008, 2508, 3008 for hybrid operation).

In some cases, the first mode includes geothermal cooling of the heat transfer fluid in the geothermal heat exchanger portion only, as per 502, 1002, 1502, 2002, 2502, and 3002. The determining step includes comparing the temperature of the heat transfer fluid at the predetermined point to a maximum allowable value, as at 504, 1004, 1504, 2004, 2504, and 3004. The second mode includes both the ambient air cooling of the heat transfer fluid in the outdoor heat exchanger portion and the geothermal cooling of the heat transfer fluid in the geothermal heat exchanger portion (e.g., proceed to 516, 1016, 1508, 2008, 2508, 3008 for hybrid operation).

In such cases, additional steps include comparing the temperature of the heat transfer fluid at the predetermined point to a minimum allowable value while operating in the second mode, as per 518, 1018, 1514, 2014, 2514, 3014; and, responsive to the temperature of the heat transfer fluid at the predetermined point being less than the minimum allowable value, ceasing one of the ambient air cooling of the heat transfer fluid in the outdoor heat exchanger portion and the geothermal cooling of the heat transfer fluid in the geothermal heat exchanger portion (as per 520, 522; 1020, 1022; 1516, 1518; 2016, 2018; 2516, 2518; or 3016; 3018).

In some instances, such as FIGS. 1, 11, and 21, the outdoor heat exchanger portion and the geothermal heat exchanger portion are arranged in parallel, and the second mode includes passing a first fraction of flow of the heat transfer fluid through the outdoor heat exchanger portion and a second fraction of the flow of the heat transfer fluid through the geothermal heat exchanger portion (the two fractions add up to 100%). As seen, e.g., in FIG. 1, in some cases, the second mode includes cooling the second fraction of the flow of the heat transfer fluid through the geothermal heat exchanger portion by passing same through a coil 187 in contact with earth that is cooler than the heat transfer fluid passing through the geothermal heat exchanger portion. A "coil" should be broadly construed to encompass a variety of heat exchanger types.

As seen, e.g., in FIG. 11, in some cases, the second mode includes cooling the second fraction of the flow of the heat transfer fluid through the geothermal heat exchanger portion by passing same through a liquid-to-liquid heat exchanger 1194 having a flow of groundwater that is cooler than the heat transfer fluid passing through the geothermal heat exchanger portion.

As seen, e.g., in FIG. 21, in some cases, the heat transfer fluid is a first heat transfer fluid and the second mode includes cooling the second fraction of the flow of the first heat transfer fluid through the geothermal heat exchanger portion by passing same through a liquid-to-liquid heat exchanger 2194 having a flow of a second heat transfer fluid that is cooler than the first heat transfer fluid passing through the geothermal heat exchanger portion (second heat transfer fluid can be same or different than first heat transfer fluid and is pumped through loop 2196 by Pump-2 1255). The second heat transfer fluid is cooled by passing same through a coil 2192 in contact with earth that is cooler than the second heat transfer fluid.

In some instances, such as FIGS. 6, 16, and 26, the outdoor heat exchanger portion and the geothermal heat exchanger portion are arranged in series, and the second mode includes passing the entire flow of the heat transfer fluid through the outdoor heat exchanger portion and the geothermal heat exchanger portion. In some cases, such as FIG. 6, the second mode includes cooling the flow of the heat transfer fluid through the geothermal heat exchanger portion by passing same through a coil 187 in contact with earth that is cooler than the heat transfer fluid through the geothermal heat exchanger portion.

In some cases, such as FIG. 16, the second mode includes cooling the flow of the heat transfer fluid through the geothermal heat exchanger portion by passing same through a liquid-to-liquid heat exchanger 1194 having a flow of groundwater that is cooler than the heat transfer fluid through the geothermal heat exchanger portion.

In some cases, such as FIG. 26, the heat transfer fluid is a first heat transfer fluid, and the second mode includes cooling the flow of the heat transfer fluid through the geothermal heat exchanger portion by passing same through a liquid-to-liquid heat exchanger 2194 having a flow of a second heat transfer fluid that is cooler than the first heat transfer fluid passing through the geothermal heat exchanger portion (second heat transfer fluid can be same or different than first heat transfer fluid and is pumped through loop 2196 by Pump-2 1255). The second heat transfer fluid is cooled by passing same through a coil 2192 in contact with earth that is cooler than the second heat transfer fluid.

In another aspect, an exemplary data center cooling system includes an indoor portion 100 wherein heat is absorbed from components 104, 106 in the data center by a heat transfer fluid; an outdoor heat exchanger portion 103 in loops 197, 1197, 2197 and a geothermal heat exchanger portion 199, 1199, 2199. The outdoor heat exchanger portion and geothermal heat exchanger portion are in selective fluid communication with the indoor portion. Also included is a valve arrangement (e.g., 193, 195; 693, 695; 1193, 1195; 1693, 1695; 2193, 2195; 2693, 2695) configured to switch the data center cooling system between first and second modes of operation.

The first and second modes have been discussed above in connection with the exemplary method.

Figure 35:
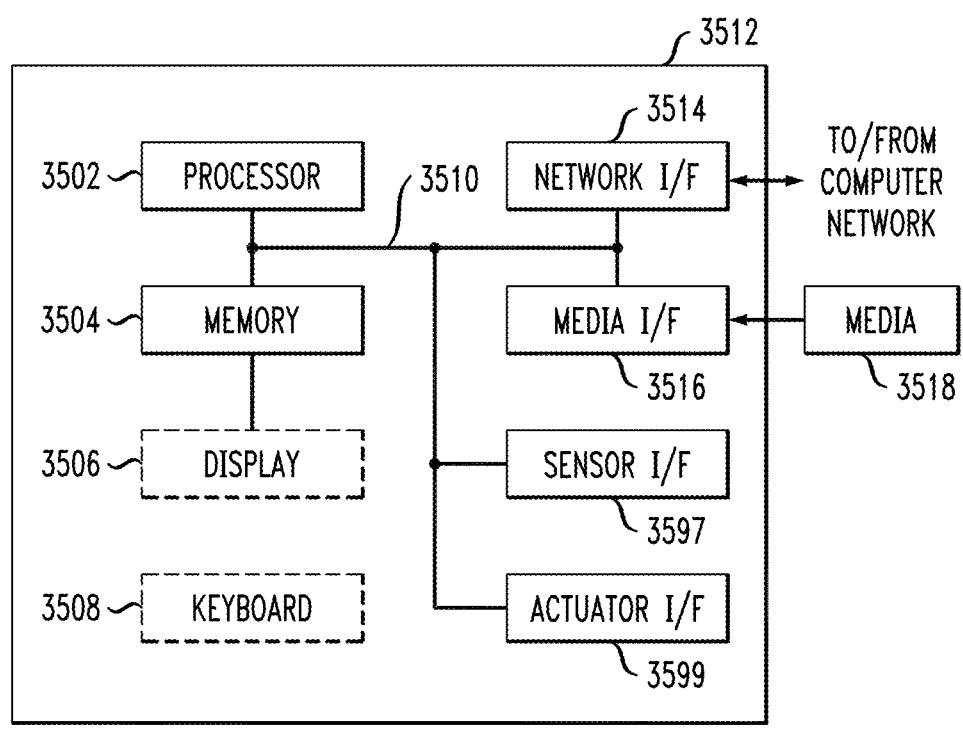
FIG. 35 depicts a computer system that may be useful in implementing one or more aspects and/or elements of the invention.

In some cases, the system also includes a control unit (see discussion of FIG. 35 below) coupled to the valve arrangement and configured to determine, based on an appropriate metric, that a switch should be made from the first mode to the second mode (using, e.g., the computer of FIG. 35 programmed with the logic in the flow charts). The valve arrangement switches the system to the second mode responsive to the determination by the control unit.

In a non-limiting example, the control unit includes outdoor air temperature sensor 109, coolant temperature sensor 189, and ground (or groundwater) temperatures sensor 191. The sensor could be, for example, a thermocouple or the like coupled to logic in a processor as described below with regard to FIG. 35. Mechanical or electromechanical techniques, such as a bimetallic strip with contacts, could also be used. Appropriate logic, such as described with regard to FIG. 35, could also be used to implement any of the other approaches, such as determining that a particular calendar day has been reached (calendar or clock logic in machine 3512), making a determination based on local meteorological data (e.g., interface to a weather web site or programming based on historical data), and the like.

In some cases, the control unit makes the determination based on at least one of time, heat dissipation from the components, outdoor air temperature, ground heat sink temperature (defined above), and temperature of the heat transfer fluid at a predetermined point.

In some cases, as discussed above with respect to the exemplary method, the first mode includes geothermal cooling of the heat transfer fluid in the geothermal heat exchanger portion only; the control unit makes the determination by comparing the temperature of the heat transfer fluid at the predetermined point to a maximum allowable value; and the second mode includes at least the ambient air cooling of the heat transfer fluid in the outdoor heat exchanger portion.

In some cases, as discussed above with respect to the exemplary method, the first mode includes geothermal cooling of the heat transfer fluid in the geothermal heat exchanger portion only; the control unit makes the determination by comparing the temperature of the heat transfer fluid at the predetermined point to a maximum allowable value; and the second mode includes the ambient air cooling of the heat transfer fluid in the outdoor heat exchanger portion and the geothermal cooling of the heat transfer fluid in the geothermal heat exchanger portion. Again, as discussed above with respect to the exemplary method, the control unit compares the temperature of the heat transfer fluid at the predetermined point to a minimum allowable value while operating in the second mode; and, responsive to the temperature of the heat transfer fluid at the predetermined point being less than the minimum allowable value, the control unit operates the valve arrangement to cease one of the ambient air cooling of the heat transfer fluid in the outdoor heat exchanger portion and the geothermal cooling of the heat transfer fluid in the geothermal heat exchanger portion.

As also discussed above with respect to the exemplary method, in some cases, such as FIGS. 1, 11, and 21, the outdoor heat exchanger portion and the geothermal heat exchanger portion are arranged in parallel, and the valve arrangement is configured to, during the second mode, pass a first fraction of flow of the heat transfer fluid through the outdoor heat exchanger portion and a second fraction of the flow of the heat transfer fluid through the geothermal heat exchanger portion. For example, as seen in FIG. 1, in some cases, the geothermal heat exchanger portion includes a coil 187 in contact with earth; and the valve arrangement is configured to, during the second mode, cause the second fraction of the flow of the heat transfer fluid through the geothermal heat exchanger portion to pass through the coil.

In some cases, such as FIG. 11, the geothermal heat exchanger portion includes a liquid-to-liquid heat exchanger 1194 having a flow of groundwater; and the valve arrangement is configured to, during the second mode, cause the second fraction of the flow of the heat transfer fluid through the geothermal heat exchanger portion to pass through the liquid-to-liquid heat exchanger 1194.

In some cases, such as FIG. 21, the heat transfer fluid is a first heat transfer fluid; and the geothermal heat exchanger portion includes a liquid-to-liquid heat exchanger 2194 having a flow of a second heat transfer fluid; and a coil 2192 in contact with earth; such coil is in fluid communication with the second heat transfer fluid in the liquid-to-liquid heat exchanger. The valve arrangement is configured to, during the second mode, cause the second fraction of the flow of the heat transfer fluid through the geothermal heat exchanger portion to pass through the liquid-to-liquid heat exchanger.

As also discussed above with respect to the exemplary method, in some cases, such as FIGS. 6, 16, and 26, the outdoor heat exchanger portion and the geothermal heat exchanger portion are arranged in series, and the valve arrangement is configured to, during the second mode, pass the entire flow of the heat transfer fluid through the outdoor heat exchanger portion and the geothermal heat exchanger portion.

For example, as seen in FIG. 6, in some cases, the geothermal heat exchanger portion includes a coil 187 in contact with earth; and the valve arrangement is configured to, during the second mode, cause the flow of the heat transfer fluid through the geothermal heat exchanger portion to pass through the coil.

For example, as seen in FIG. 16, in some cases, the geothermal heat exchanger portion includes a liquid-to-liquid heat exchanger 1194 having a flow of groundwater; and the valve arrangement is configured to, during the second mode, cause the flow of the heat transfer fluid through the geothermal heat exchanger portion to pass through the liquid-to-liquid heat exchanger.

For example, as seen in FIG. 26, in some cases, the heat transfer fluid includes a first heat transfer fluid; and the geothermal heat exchanger portion includes a liquid-to-liquid heat exchanger 2194 having a flow of a second heat transfer fluid; and a coil 2192 in contact with earth, which coil is in fluid communication with the second heat transfer fluid in the liquid-to-liquid heat exchanger. Furthermore, the valve arrangement is configured to, during the second mode, cause the flow of the heat transfer fluid through the geothermal heat exchanger portion to pass through the liquid-to-liquid heat exchanger.

In another aspect, a data center cooling system (FIGS. 31-33) includes an indoor portion wherein heat is absorbed from electronic components (e.g., in the rack 104) in the data center by a heat transfer fluid; and a geothermal heat exchanger portion (e.g., 187; 1194, 1196, 1255; 2194, 2196, 2192, 1255) in thermal communication with the indoor portion and configured to reject the heat to at least one of earth (FIGS. 31 and 33) and groundwater (FIG. 32). Methods of operating such a system include pumping a fluid through a heat exchanger (rack and/or side car) to absorb heat from electronic components; and rejecting such heat to groundwater and/or earth, either directly or via a liquid-to-liquid heat exchanger with groundwater or a second loop.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. For the avoidance of doubt, most embodiments include physical heat transfer and fluid flow hardware which may be computer controlled, controlled by humans, controlled by electromechanical and/or bimetallic controllers, and the like; a software embodiment could include, for example, a computer readable storage medium with instructions for system control and/or design functionality.

One or more embodiments of the invention, or elements thereof, can be implemented in the form of an apparatus including a memory and at least one processor that is coupled to the memory and operative to perform exemplary method steps.

One or more embodiments can make use of software running on a general purpose computer or workstation. With reference to FIG. 35, such an implementation might employ, for example, a processor 3502, a memory 3504, and an input/output interface formed, for example, by a display 3506 and a keyboard 3508. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 3502, memory 3504, and input/output interface such as display 3506 and keyboard 3508 can be interconnected, for example, via bus 3510 as part of a data processing unit 3512. Suitable interconnections, for example via bus 3510, can also be provided to a network interface 3514, such as a network card, which can be provided to interface with a computer network, and to a media interface 3516, such as a diskette or CD-ROM drive, which can be provided to interface with media 3518.

Suitable interfaces can be provided to receive signals from sensors (e.g., temperature, pressure, flow rate, heat dissipation, and/or valve position sensors) and/or to send signals to actuators for valves, vents, fans, and the like. These could be provided over network interface 3514 and/or via separate sensor interface 3597 and/or separate actuator interface 3599, including, for example, suitable digital-to-analog and/or analog-to-digital converters.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 3502 coupled directly or indirectly to memory elements 3504 through a system bus 3510. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 3508, displays 3506, pointing devices, and the like) can be coupled to the system either directly (such as via bus 3510) or through intervening I/O controllers (omitted for clarity).

Network adapters such as network interface 3514 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 3512 as shown in FIG. 35) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 3518 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, one or more distinct software modules for control (e.g., to control the cooling systems using the logic in the flow charts) and/or system design. The method steps can then be carried out, or at least facilitated by, using the distinct software modules and/or sub-modules of the system, as described above, executing on one or more hardware processors 3502. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   operating a data center cooling system in a first mode, said data center cooling system having an indoor portion wherein heat is absorbed from components in said data center by a heat transfer fluid, said data center cooling system having an outdoor heat exchanger portion and a geothermal heat exchanger portion, said first mode comprising at least one of:
    ambient air cooling of said heat transfer fluid in said outdoor heat exchanger portion; and
    geothermal cooling of said heat transfer fluid in said geothermal heat exchanger portion;
determining, based on an appropriate metric, that a switch should be made from said first mode to a second mode; and
responsive to said determining, switching said data center cooling system to said second mode, said second mode being different than said first mode, said second mode comprising at least another one of:
    ambient air cooling of said heat transfer fluid in said outdoor heat exchanger portion; and
    geothermal cooling of said heat transfer fluid in said geothermal heat exchanger portion;
wherein said determining step comprises determining based on at least one of time, heat dissipation from said components, outdoor air temperature, ground heat sink temperature, and temperature of said heat transfer fluid at a predetermined point;
wherein:
said first mode comprises geothermal cooling of said heat transfer fluid in said geothermal heat exchanger portion only;
said determining step comprises comparing said temperature of said heat transfer fluid at said predetermined point to a maximum allowable value; and
said second mode comprises said ambient air cooling of said heat transfer fluid in said outdoor heat exchanger portion and said geothermal cooling of said heat transfer fluid in said geothermal heat exchanger portion;
further comprising:
comparing said temperature of said heat transfer fluid at said predetermined point to a minimum allowable value while operating in said second mode; and
responsive to said temperature of said heat transfer fluid at said predetermined point being less than said minimum allowable value, ceasing one of said ambient air cooling of said heat transfer fluid in said outdoor heat exchanger portion and said geothermal cooling of said heat transfer fluid in said geothermal heat exchanger portion;
wherein said outdoor heat exchanger portion and said geothermal heat exchanger portion are arranged in parallel, and wherein said second mode comprises passing a first fraction of flow of said heat transfer fluid through said outdoor heat exchanger portion and a second fraction of said flow of said heat transfer fluid through said geothermal heat exchanger portion; and
wherein said second mode comprises cooling said second fraction of said flow of said heat transfer fluid through said geothermal heat exchanger portion by passing same through a liquid-to-liquid heat exchanger having a flow of groundwater that is cooler than said heat transfer fluid passing through said geothermal heat exchanger portion.

2. A method comprising:
operating a data center cooling system in a first mode, said data center cooling system having an indoor portion wherein heat is absorbed from components in said data center by a heat transfer fluid, said data center cooling system having an outdoor heat exchanger portion and a geothermal heat exchanger portion, said first mode comprising at least one of:
    ambient air cooling of said heat transfer fluid in said outdoor heat exchanger portion; and
    geothermal cooling of said heat transfer fluid in said geothermal heat exchanger portion;
determining, based on an appropriate metric, that a switch should be made from said first mode to a second mode; and
responsive to said determining, switching said data center cooling system to said second mode, said second mode being different than said first mode, said second mode comprising at least another one of:
    ambient air cooling of said heat transfer fluid in said outdoor heat exchanger portion; and
    geothermal cooling of said heat transfer fluid in said geothermal heat exchanger portion;
wherein said determining step comprises determining based on at least one of time, heat dissipation from said components, outdoor air temperature, ground heat sink temperature, and temperature of said heat transfer fluid at a predetermined point;
wherein:
said first mode comprises geothermal cooling of said heat transfer fluid in said geothermal heat exchanger portion only;
said determining step comprises comparing said temperature of said heat transfer fluid at said predetermined point to a maximum allowable value; and
said second mode comprises said ambient air cooling of said heat transfer fluid in said outdoor heat exchanger portion and said geothermal cooling of said heat transfer fluid in said geothermal heat exchanger portion;
further comprising:
comparing said temperature of said heat transfer fluid at said predetermined point to a minimum allowable value while operating in said second mode; and
responsive to said temperature of said heat transfer fluid at said predetermined point being less than said minimum allowable value, ceasing one of said ambient air cooling of said heat transfer fluid in said outdoor heat exchanger portion and said geothermal cooling of said heat transfer fluid in said geothermal heat exchanger portion;
wherein said outdoor heat exchanger portion and said geothermal heat exchanger portion are arranged in parallel, and wherein said second mode comprises passing a first fraction of flow of said heat transfer fluid through said outdoor heat exchanger portion and a second fraction of said flow of said heat transfer fluid through said geothermal heat exchanger portion; and
wherein said heat transfer fluid comprises a first heat transfer fluid, and wherein said second mode comprises:
    cooling said second fraction of said flow of said first heat transfer fluid through said geothermal heat exchanger portion by passing same through a liquid-to-liquid heat exchanger having a flow of a second heat transfer fluid that is cooler than said first heat transfer fluid passing through said geothermal heat exchanger portion; and
    cooling said second heat transfer fluid by passing same through a coil in contact with earth that is cooler than said second heat transfer fluid.

3. A method comprising:

operating a data center cooling system in a first mode, said data center cooling system having an indoor portion wherein heat is absorbed from components in said data center by a heat transfer fluid, said data center cooling system having an outdoor heat exchanger portion and a geothermal heat exchanger portion, said first mode comprising at least one of:

ambient air cooling of said heat transfer fluid in said outdoor heat exchanger portion; and geothermal cooling of said heat transfer fluid in said geothermal heat exchanger portion;

determining, based on an appropriate metric, that a switch should be made from said first mode to a second mode; and responsive to said determining, switching said data center cooling system to said second mode, said second mode being different than said first mode, said second mode comprising at least another one of:

ambient air cooling of said heat transfer fluid in said outdoor heat exchanger portion; and geothermal cooling of said heat transfer fluid in said geothermal heat exchanger portion;

wherein said determining step comprises determining based on at least one of time, heat dissipation from said components, outdoor air temperature, ground heat sink temperature, and temperature of said heat transfer fluid at a predetermined point;

wherein:

said first mode comprises geothermal cooling of said heat transfer fluid in said geothermal heat exchanger portion only;

said determining step comprises comparing said temperature of said heat transfer fluid at said predetermined point to a maximum allowable value; and said second mode comprises said ambient air cooling of said heat transfer fluid in said outdoor heat exchanger portion and said geothermal cooling of said heat transfer fluid in said geothermal heat exchanger portion;

further comprising:

comparing said temperature of said heat transfer fluid at said predetermined point to a minimum allowable value while operating in said second mode; and responsive to said temperature of said heat transfer fluid at said predetermined point being less than said minimum allowable value, ceasing one of said ambient air cooling of said heat transfer fluid in said outdoor heat exchanger portion and said geothermal cooling of said heat transfer fluid in said geothermal heat exchanger portion;

wherein said outdoor heat exchanger portion and said geothermal heat exchanger portion are arranged in series, and wherein said second mode comprises passing an entire flow of said heat transfer fluid through said outdoor heat exchanger portion and said geothermal heat exchanger portion.

4. The method of claim 3, wherein said second mode comprises cooling said flow of said heat transfer fluid through said geothermal heat exchanger portion by passing same through a coil in contact with earth that is cooler than said heat transfer fluid through said geothermal heat exchanger portion.

5. The method of claim 3, wherein said second mode comprises cooling said flow of said heat transfer fluid through said geothermal heat exchanger portion by passing same through a liquid-to-liquid heat exchanger having a flow of groundwater that is cooler than said heat transfer fluid through said geothermal heat exchanger portion.

6. The method of claim 3, wherein said heat transfer fluid comprises a first heat transfer fluid, and wherein said second mode comprises:

cooling said flow of said heat transfer fluid through said geothermal heat exchanger portion by passing same through a liquid-to-liquid heat exchanger having a flow of a second heat transfer fluid that is cooler than said first heat transfer fluid passing through said geothermal heat exchanger portion; and cooling said second heat transfer fluid by passing same through a coil in contact with earth that is cooler than said second heat transfer fluid.

* * * * *